(12) United States Patent
Huang et al.

(10) Patent No.: US 7,592,128 B2
(45) Date of Patent: Sep. 22, 2009

(54) ON-PRESS DEVELOPABLE NEGATIVE-WORKING IMAGEABLE ELEMENTS

(75) Inventors: Jianbing Huang, Trumbull, CT (US); Kevin B. Ray, Fort Collins, CO (US); Scott A. Beckley, Windsor, CO (US)

(73) Assignee: Eastman Kodak Company, Rochester, NY (US)

( * ) Notice: Subject to any disclaimer, the term of this patent is extended or adjusted under 35 U.S.C. 154(b) by 319 days.

(21) Appl. No.: 11/500,261

(22) Filed: Aug. 7, 2006

(65) Prior Publication Data

US 2006/0269874 A1 Nov. 30, 2006

Related U.S. Application Data

(63) Continuation-in-part of application No. 11/091,124, filed on Mar. 28, 2005, now Pat. No. 7,258,964, which is a continuation of application No. 10/119,454, filed on Apr. 10, 2002, now Pat. No. 6,899,994, which is a continuation-in-part of application No. 09/826,300, filed on Apr. 4, 2001, now Pat. No. 6,582,882.

(51) Int. Cl.
- G03F 7/028 (2006.01)
- G03F 7/032 (2006.01)
- G03F 7/20 (2006.01)
- G03F 7/30 (2006.01)
- B41N 3/08 (2006.01)

(52) U.S. Cl. .......... 430/302; 430/281.1; 430/278.1; 430/285.1; 430/905; 430/916; 430/925; 430/944; 101/456; 101/467; 101/450.1; 101/451; 101/453; 101/457; 101/465; 101/466

(58) Field of Classification Search .......... None
See application file for complete search history.

(56) References Cited

U.S. PATENT DOCUMENTS

| | | | |
|---|---|---|---|
| 4,997,745 A | 3/1991 | Kawamura et al. | 430/281 |
| 5,204,222 A | 4/1993 | Gersdorf et al. | 430/281 |
| 5,491,046 A | 2/1996 | DeBoer et al. | |
| 5,496,903 A | 3/1996 | Watanabe et al. | |
| 5,545,676 A | 8/1996 | Palazzotto et al. | 522/15 |
| 5,599,650 A | 2/1997 | Bi et al. | |
| 5,658,708 A | 8/1997 | Kondo | 430/288.1 |
| 5,756,258 A | 5/1998 | Yamaoka et al. | 430/281.1 |
| 5,763,134 A | 6/1998 | Busman et al. | 430/157 |
| 5,800,965 A | 9/1998 | Tsuji et al. | 430/287.1 |
| 5,914,215 A | 6/1999 | West et al. | 430/278.1 |
| 5,948,599 A | 9/1999 | Gardner et al. | 430/330 |
| 6,022,667 A | 2/2000 | Vermeersch et al. | 430/271.1 |
| 6,037,102 A | 3/2000 | Loerzer et al. | 430/306 |
| 6,071,369 A | 6/2000 | Vermeersch et al. | 156/272.8 |
| 6,071,675 A | 6/2000 | Teng | 430/302 |
| 6,242,156 B1 | 6/2001 | Teng | |
| 6,245,481 B1 | 6/2001 | Teng | 430/270.1 |
| 6,245,486 B1 | 6/2001 | Teng | 430/303 |
| 6,309,792 B1 | 10/2001 | Hauck et al. | 430/270.1 |
| 6,482,571 B1 | 11/2002 | Teng | |
| 6,489,078 B1 | 12/2002 | Van Damme et al. | |
| 6,541,183 B2 | 4/2003 | Teng | |
| 6,576,401 B2 | 6/2003 | Teng | |
| 6,582,882 B2 | 6/2003 | Pappas et al. | |
| 6,846,614 B2 | 1/2005 | Timpe et al. | |
| 6,864,040 B2 | 3/2005 | Muller et al. | |
| 6,884,560 B2 | 4/2005 | Yanaka et al. | |
| 6,899,994 B2 | 5/2005 | Huang et al. | |
| 7,005,234 B2 | 2/2006 | Hoshi et al. | |
| 7,189,494 B2 * | 3/2007 | Knight et al. | 430/281.1 |
| 2002/0068240 A1 | 6/2002 | Teng | |
| 2003/0035936 A1 | 2/2003 | Takahashi et al. | |
| 2003/0075066 A1 | 4/2003 | Tan et al. | |
| 2003/0143488 A1 | 7/2003 | Teng | |
| 2003/0165777 A1 | 9/2003 | Teng | |
| 2004/0229165 A1 | 11/2004 | Munnelly et al. | |
| 2004/0265736 A1 | 12/2004 | Aoshima et al. | |
| 2005/0003285 A1 | 1/2005 | Hayashi et al. | |
| 2005/0263021 A1 | 12/2005 | Mitsumoto et al. | |

FOREIGN PATENT DOCUMENTS

DE   41 08 496   10/1991

(Continued)

OTHER PUBLICATIONS

Guo, et al. *Effects of salt on the intrinsic viscosity of model alkali-soluble associative polymers*, Molecular Chemistry and Physics, 1996, pp. 1175-1184.

(Continued)

*Primary Examiner*—Sin J. Lee
(74) *Attorney, Agent, or Firm*—J. Lanny Tucker

(57) ABSTRACT

The present invention relates to negative-working imageable elements that can be used for the manufacture of printing plates. These imageable elements can be developed on on-press by the action of a lithographic printing ink used in combination with either water or a fountain solution. The imageable elements comprise an imageable layer that is not removable in water or fountain solution alone. The imageable layer includes a free radically polymerizable compound, a free radical initiator composition, an infrared radiation absorbing compound, and a polymeric binder comprising poly(alkylene oxide) pendant groups, and preferably additionally pendant cyano groups.

13 Claims, 9 Drawing Sheets

FOREIGN PATENT DOCUMENTS

| | | |
|---|---|---|
| DE | 9648311 | 5/1997 |
| EP | 041 51 87 | 3/1991 |
| EP | 051 06 46 | 10/1992 |
| EP | 0514145 | 11/1992 |
| EP | 0522175 | 1/1993 |
| EP | 0599510 | 6/1994 |
| EP | 0672544 | 9/1995 |
| EP | 0672954 | 9/1995 |
| EP | 0730201 | 9/1996 |
| EP | 0816070 | 1/1998 |
| EP | 0819980 | 1/1998 |
| EP | 0819985 | 1/1998 |
| EP | 0823327 | 2/1998 |
| EP | 0839647 | 5/1998 |
| EP | 0881096 | 12/1998 |
| EP | 1 117 005 A1 | 7/2001 |
| EP | 1117005 | 7/2001 |
| JP | 6068992 | 9/1983 |
| JP | 2-277695 | 11/1990 |
| JP | 1138633 | 7/1997 |
| JP | 2005-335366 | 12/2005 |
| WO | 9739894 | 10/1997 |
| WO | 99/67097 | 12/1999 |
| WO | 0048836 | 8/2000 |

OTHER PUBLICATIONS

Full English translation of JP 52-102023.
JP Abstract 62121445, Jun. 2, 1987.
JP Abstract 52102023, Aug. 26, 1977.
JP Abstract 2-277695, Nov. 14, 1990.
U.S. Patent Application for "High Speed Negative Working Thermal Printing Plates", U.S. Appl. No. 10/040,241.

\* cited by examiner

ON-PRESS DEVELOPABLE NEGATIVE-WORKING IMAGEABLE ELEMENTS

CROSS REFERENCE TO RELATED APPLICATIONS

This application is a continuation-in-part of and commonly assigned U.S. Ser. No. 11/091,124 that was filed Mar. 28, 2005 now U.S. Pat. No. 7,258,964 as a continuation of U.S. Ser. No. 10/119,454 that was filed Apr. 10, 2002 and is now U.S. Pat. No. 6,899,994 and that in turn, is a continuation-in-part of commonly assigned U.S. Ser. No. 09/826,300 that was filed Apr. 4, 2001 and is now U.S. Pat. No. 6,582,882. Each of the foregoing related applications and patents is incorporated herein by reference in its entirety.

FIELD OF THE INVENTION

The present invention relates to on-press developable, negative-working imageable elements that can be used to prepare lithographic printing plates. This invention also relates to methods of imaging these imageable elements and then developing them on-press.

BACKGROUND OF THE INVENTION

Radiation-sensitive compositions are routinely used in the preparation of high-performance printing plate precursors (or imageable elements). There are primarily two ways of improving the properties of radiation-sensitive compositions and thus also improving the properties of the corresponding printing plate precursors. The first way addresses improvement of the properties of the radiation-sensitive components in the compositions (frequently negative diazo resins or photoinitiators). The other way deals with improvement of physical properties of the radiation-sensitive layers through the use of novel polymeric compounds ("binders").

The latest developments in the field of printing plate precursors are concerned with radiation-sensitive compositions that can be imagewise exposed by means of lasers or laser diodes. This type of exposure does not require films as intermediate information carriers since lasers can be controlled by computers.

High-performance lasers or laser diodes that are used in commercially available image-setters emit light in the wavelength ranges of between 800 to 850 nm and between 1060 and 1120 nm, respectively. Therefore, printing plate precursors, or initiator systems contained therein, which are to be imagewise exposed by means of such image-setters have to be sensitive in the near IR range. Such printing plate precursors can then basically be handled under daylight conditions that significantly facilitate their production and processing.

There are two possible ways of using radiation-sensitive compositions for the preparation of printing plates. For negative-working printing plates, radiation-sensitive compositions are used wherein after an imagewise exposure the exposed areas are cured. In a developing step, only the non-exposed areas are removed from the substrate. For positive-working printing plates, radiation-sensitive compositions are used whose exposed areas dissolve faster in a given developing agent than the non-exposed areas. This process is referred to as photo-solubilization.

Negative-working imageable elements that typically require a preheating step after imagewise exposure are described for example in EP Publications 0 672 544A1 (Bauer et al.), 0 672 954A1 (Haley et al.), and 0 819 985A1 (VanDamme et al.) as well as U.S. Pat. No. 5,491,046 (DeBoer et al.). In U.S. Pat. No. 5,496,903 (Watanabe et al.) and DE 196 48 311 (Cunningham et al.), photosensitive compositions are described which in addition to a dye absorbing in the IR range comprise borate or halogenated s-triazines as co-initiators.

U.S. Pat. No. 6,245,486 (Teng) discloses radiation sensitive printing plates, including on-press developable plates. U.S. Pat. No. 6,245,481 (Teng) discloses IR-ablatable, UV-photopolymerizable two-layer compositions that require IR exposure followed by UV flood irradiation. U.S. Pat. No. 5,599,650 (Bi et al.) discloses UV imageable, negative-working, on press developable printing plates based on free radical polymerization. U.S. Pat. No. 6,071,675 (Teng) discloses printing plates that include dispersed solid particles in the imaging layer.

U.S. Pat. No. 6,309,792 (Hauck et al.) describes IR-sensitive compositions comprising a polymeric binder, a free radically polymerizable system, and a specific initiator system. The compositions of WO 00/48836 require a preheat step after the exposure for sufficient hardening of the compositions and the printing plate precursors must be developed with an aqueous developer. U.S. Pat. No. 6,864,040 (Mueller et al.) describes IR sensitive compositions containing leuco dyes and requires a preheat step after IR exposure and an aqueous development step for processing.

U.S. Pat. No. 6,582,882 (Pappas et al.) discloses graft copolymers comprising polyethylene oxide side chains that may further comprise a hydrophobic segment between the polyethylene oxide segment and the main chain, and a hydrophobic segment at the terminus of the polyethylene oxide side chains. U.S. Pat. No. 6,846,614 (Timpe et al.) discloses poly(alkylene oxide) polymers and copolymers, including block copolymers of poly(ethylene oxide) and poly(propylene oxide).

On-press developable imageable elements are also described in U.S. Pat. No. 6,242,156 (Teng), U.S. Pat. No. 6,482,571 (Teng), U.S. Pat. No. 6,541,183 (Teng), U.S. Pat. No. 6,576,401 (Teng), U.S. Pat. No. 6,884,560 (Yanake et al.), and U.S. Pat. No.6,899,994 (Huang et al.) and U.S. Patent Application Publications 2003/0143488 (Teng), 2003/0165777 (Teng), 2004/0265736 (Aoshima et al.), 2004/0229165 (Munnelly et al.), and 2005/0003285 (Hayashi et al.).

U.S. Pat. No. 7,005,234 (Hoshi et al.) describes negative-working, IR-sensitive imageable elements that are said to be developed on-press by solubilizing or dispersing the non-exposed regions of the imageable layer with water. Similarly, U.S. Patent Application Publication 2005/0263021 (Mitsamoto et al.) describes removing non-exposed regions in the imaged element with an aqueous solution.

Problem to be Solved

While the literature describes numerous imaging compositions that can be used in on-press development to provide lithographic printing plates, there is a continuing need to provide improved imageable elements and imaging methods to reduce the time and impressions required to achieve complete image development. In particular, it is desired to have imageable elements that can easily and quickly be developed on-press within a few initial printing impressions and that will provide quality impressions for "short-run jobs" (for example, less than 10,000 impressions).

Moreover, there is a need to minimize contamination of the fountain solution from the imageable layer components of imageable elements during on-press development. Such contamination may lead to a color shift of the lithographic printing ink on printed sheets, dot gain characteristics of the printing system, over-emulsification of the lithographic printing inks, toning in non-imaged areas, and clogging of the fountain solution filtration system.

SUMMARY OF THE INVENTION

This invention provides an on-press developable, negative-working imageable element comprising an infrared radiation imageable layer on a substrate, the imageable layer comprising:
  a free radically polymerizable component,
  a free radical initiator composition,
  an infrared radiation absorbing compound, and
  a polymer binder,
  the imageable layer being completely removable prior to irradiation only when contacted, sequentially or simultaneously, with either water or a fountain solution and a lithographic printing ink.

This invention also provides a method of providing a lithographic printing plate comprising:
  A) imagewise exposing the imageable element of this invention to provide an imaged element with an imaged layer containing both exposed regions and non-exposed regions,
  B) prior or subsequently to step A, mounting the imageable element onto a lithographic printing press,
  C) after steps A and B, contacting the imaged layer on-press with water or a fountain solution but not a lithographic printing ink for sufficient time to swell the non-exposed regions of the imaged layer but leaving the non-exposed regions of the imaged layer substantially intact on the substrate,
  D) contacting the imaged layer with swollen non-exposed regions simultaneously with water or fountain solution and a lithographic printing ink to substantially remove the non-exposed regions only, and
  E) simultaneously with or subsequently to step D, using the imaged element to print an image on a receiver material.

Further, this invention provides a planographic printing method comprising:
  A) imagewise exposing the imageable element of this invention to provide an imaged element with an imaged layer containing both exposed regions and non-exposed regions,
  B) while the imaged element is on-press, removing the non-exposed regions of the imaged layer by the joint action (for example, simultaneously or sequentially supplying) of a lithographic printing ink and either water or a fountain solution, and
  C) supplying additional lithographic printing ink with either water or a fountain solution to the imaged element to provide a printed image on a receiver material.

Still again, this invention provides a method of providing a lithographic printing plate comprising:
  A) imagewise exposing the imageable element of this invention to provide an imaged element with an imaged layer containing both exposed regions and non-exposed regions,
  B) prior or subsequently to step A, mounting the imageable element onto a lithographic printing press,
  C) after steps A and B, contacting the imaged layer on-press with a lithographic printing ink but not water or a fountain solution,
  D) contacting the imaged layer with both water or fountain solution and a lithographic printing ink to substantially remove the non-exposed regions only, and
  E) simultaneously with or subsequently to step D, using the imaged element to print an image on a receiver material.

This invention further provides a method of providing a lithographic printing plate comprising:
  A) imagewise exposing the imageable element of this invention to provide an imaged element with an imaged layer containing both exposed regions and non-exposed regions,
  B) prior or subsequently to step A, mounting the imageable element onto a lithographic printing press,
  C) after steps A and B, contacting the imaged layer on-press simultaneously with both a lithographic printing ink and water or a fountain solution to substantially remove the non-exposed regions only, and
  D) simultaneously with or subsequently to step C, using the imaged element to print an image on a receiver material.

The present invention provides an improved negative-working imageable element for on-press development in which the lithographic printing ink is critical to complete development of the imaged layer. In the presence of the lithographic printing ink, development can be achieved on-press within a few printing impressions, thereby reducing "make-ready" time, and the resulting printing plate has high durability for at least 10,000 impressions. Non-exposed regions of the imaged layer are removed from the element in the drying ink on the printed impressions, at least in part. This reduces the potential for contamination, for example, of the fountain solution during on-press development.

While the imageable layer of the elements described in the prior art may be at least partially developable (or incompletely soluble) in water or fountain solution alone, the imageable elements of this invention are developed on-press by the joint action of a lithographic printing ink with water or a fountain solution so that the removed radiation-sensitive composition is dispersed in both aqueous and oleophilic ink phases. In some embodiments, this "joint action" refers to the imaged element being contacted first with water or a fountain solution to cause swelling in the non-exposed regions of the imageable layer, but then those regions are contacted with a lithographic printing ink to complete development within a few impressions. Alternatively, the imaged element can be contacted first with the lithographic printing ink, and then sequentially contacted with the water or fountain solution. Still again, the imaged element can be contacted simultaneously with a lithographic printing ink and water or fountain solution to achieve on-press (completely removing non-exposed regions) development within a few printing impressions. Thus, the non-exposed regions of the imaged element are not completely removed solely by the action of water or a fountain solution, nor are they completely removed solely by the action of the lithographic printing ink, but complete removal is achieved with the use or joint action (either sequentially or simultaneously) of both the aqueous solutions and ink.

DETAILED DESCRIPTION OF THE INVENTION

Definitions

Figure 1:
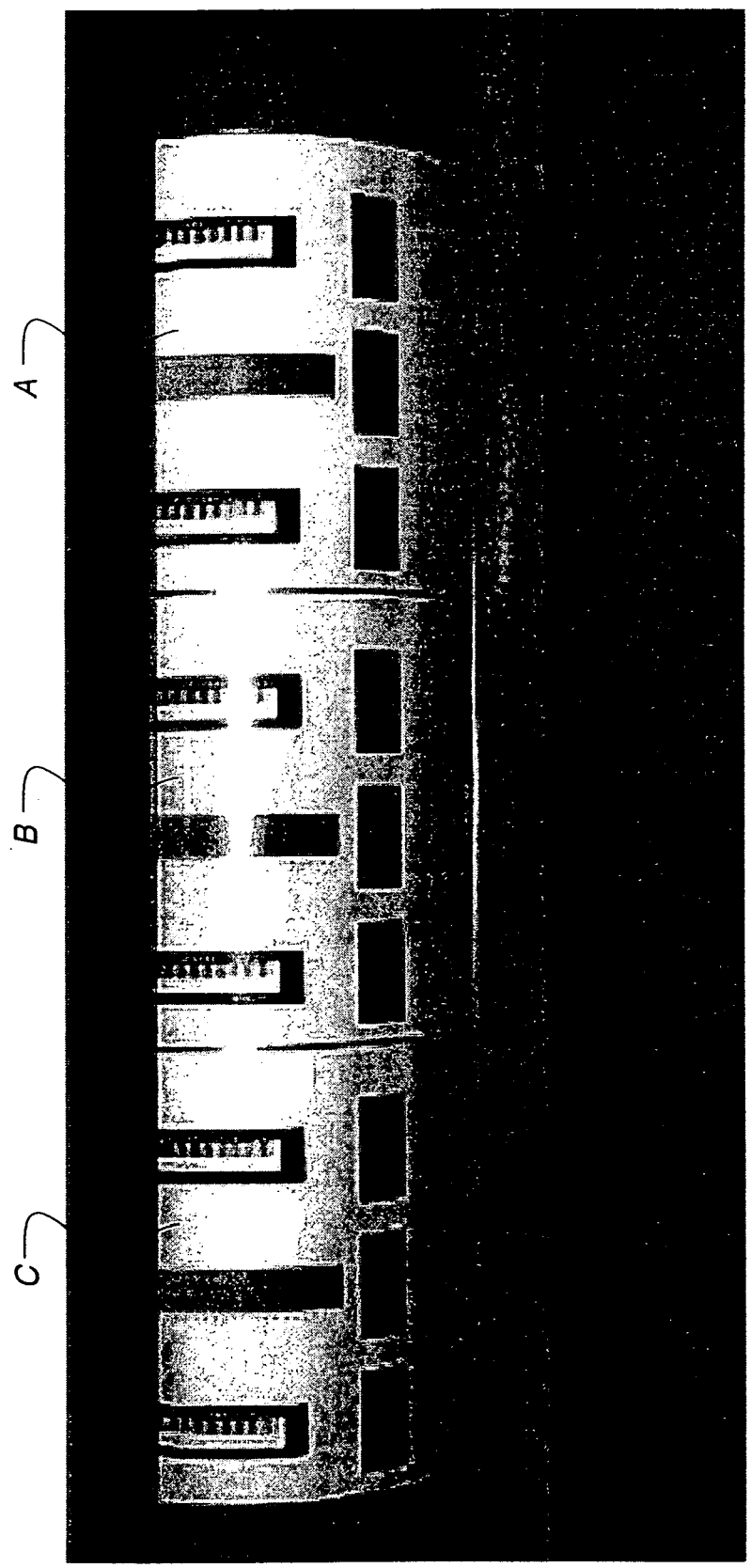
FIG. 1 is a black-and-white image showing development results described in Example 1 below.

Unless the context indicates otherwise, when used herein, the term "radiation-sensitive composition", "imageable element", and "printing plate precursor" are meant to be references to embodiments of the present invention.

In addition, unless the context indicates otherwise, the various components described herein such as "radically polymerizable component", "initiator", "co-initiator", "radiation absorbing compound", "polymeric binder", "nonionic phosphate acrylate", and similar terms also refer to mixtures of such components. Thus, the use of the articles "a", "an", and "the" is not necessarily meant to refer to only a single component.

The term "single-layer imageable element" refers to an imageable element having only one imageable layer that is essential to imaging, but as pointed out in more detail below, such elements may also include one or more layers under or over (such as a topcoat) the imageable layer to provide various properties.

Moreover, unless otherwise indicated, percentages refer to percents by dry weight.

The term "soluble" is also meant to include dispersible and fully removable, for example, in reference to non-exposed regions of the imageable layer.

The term "fountain solution" as used herein refers to a "working strength" solution that is normally used in conventional printing. It does not refer to the typical commercial concentrated solution that may be known as the "fountain concentrate" or "fountain etch", which concentrated solution is typically diluted with water prior to or during use to form a "working strength" solution. This "working strength" solution is intended to include either "fresh" solution obtained immediately upon dilution, or the "used" solution that is being used in the printing press system.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Imageable Elements

The imaging components of the imageable elements described herein are generally incorporated into a radiation-sensitive composition that may have any utility wherever there is a need for a coating that is polymerizable using suitable electromagnetic radiation, and particularly where it is desired to remove unexposed regions of the coated and imaged composition. The radiation-sensitive compositions can be used to prepare imageable elements such as printed circuit boards for integrated circuits, microoptical devices, paint compositions, molding compositions, color filters, photomasks, and preferably printed forms such as lithographic printing plate precursors and imaged printing plates that are defined in more detail below.

The imageable elements comprise an imageable layer disposed on a substrate (defined below). This imageable layer comprises a free radically polymerizable component that is preferably insoluble in water or a fountain solution alone. Moreover, before exposure to imaging radiation, the imageable layer is incompletely soluble in water or a fountain solution alone.

The free radically polymerizable component present in the radiation-sensitive composition contains one or more compounds having any polymerizable group that can be polymerized using free radical initiation. For example, the free radically polymerizable component can contain one or more free radical polymerizable monomers or oligomers having one or more addition polymerizable ethylenically unsaturated groups, crosslinkable ethylenically unsaturated groups, a ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated compounds that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Particularly useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. More particularly useful radically polymerizable compounds include those derived from urea urethane(meth)acrylates or urethane(meth)acrylates having multiple polymerizable groups. For example, a most preferred free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Other preferred free radically polymerizable compounds are available from Sartomer Company, Inc. such as SR399 (dipentaerythritol pentaacrylate), SR355 (di-trimethylolpropane tetraacrylate), SR295 (pentaerythritol tetraacrylate), and others that would be readily apparent to one skilled in the art.

Numerous other free radically polymerizable compounds are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imagining Processes and Material*, J. M. Sturge et al. (Eds.), Van Nostrand Reinhold, New York, 1989, pp. 226-262. For example, useful free radically polymerizable components are also described in EP 1,182,033A1 (noted above), beginning with paragraph [0170].

In some embodiments, the free radically polymerizable component comprises carboxy groups in an amount sufficient to provide an acid number greater than 0 mg KOH per grams of polymerizable component, and generally from 0 and up to and including 200 mg KOH per gram of the polymerizable component. Preferably, the acid number is from 0 and up to and including 100 mg KOH/gram of polymerizable component and more preferably, it is from 0 and up to and including 60 mg KOH/gram of polymerizable component.

Free radically polymerizable compounds containing carboxy groups can be prepared in a number of ways. For example, oligomers containing carboxy groups can be prepared as described in the teaching of Col. 4 (line 42) to Col. 5 (line 19) and Col. 7 (line 14) to Col. 8 (line 45) of U.S. Pat. No. 4,228,232 (Rousseau). The carboxy groups can be added to the oligomers preferably after addition of the free radical polymerizable moieties by reaction of remaining hydroxy groups on the oligomer backbone with a compound having free carboxy groups (such as a dicarboxylic acid or anhydride). The resulting oligomers can be polymerized to provide a desired carboxy-substituted polymer.

Alternatively, a poly(urea urethane)acrylate or poly(urethane)acrylate can be prepared from the reaction of a diisocyanate with a diol having free carboxy groups similarly to the preparation of allyl functional polyurethanes described in U.S. Pat. No. 5,919,600 (Huang et al.).

In preferred embodiments, the addition polymerizable ethylenically unsaturated group may be polymerizable by free radical polymerization. The free radical addition polymerizable ethylenically unsaturated group is preferably selected from the group consisting of a methacrylate group, an acrylate group, and a combination thereof. The crosslinkable ethylenically unsaturated group is preferably selected from the group consisting of a dimethylmaleimide group, a chalcone group, and a cinnamate group.

The free radically polymerizable component is present in sufficient amount to render the imageable layer insoluble in the developing liquids after exposure to radiation. The weight ratio of such component to polymeric binder is from about 5:95 to about 95:5, preferably from about 10:90 to about 90:10, and most preferably from about 30:70 to about 70:30.

The radiation-sensitive composition also includes an initiator composition that is capable of generating free radicals sufficient to initiate polymerization of the free radically polymerizable component upon exposure of the composition to imaging radiation. The initiator composition may be responsive, for example, to electromagnetic imaging radiation in the near-infrared or infrared spectral regions, corresponding to the spectral range of from aboutt 600 nm to about 1500 nm, and more preferably to imaging infrared radiation of from about 700 nm to about 1200 nm, and initiator compositions are used that are appropriate to that imaging range.

In general, suitable initiator compositions comprise compounds that include but are not limited to, amines (such as alkanol amines), thiol compounds, anilinodiacetic acids or derivatives thereof, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, alkyltriarylborates, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), borate and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S Patent Application Publication 2003/0064318 (noted above).

Co-initiators can also be used, such as metallocenes (such as titanocenes and ferrocenes), polycarboxylic acids, haloalkyl triazines, thiols or mercaptans (such as mercaptotriazoles), borate salts, and photooxidants containing a heterocyclic nitrogen that is substituted by an alkoxy or acyloxy group, as described in U.S. Pat. No. 5,942,372 (West et al.).

The preferred initiator compositions comprise an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N═N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraaryl borates, and others readily apparent to one skilled in the art.

The halonium salts are more preferred, and the iodonium salts are most preferred. In one preferred embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)-phenyl]iodonium hexafluorophosphate and is supplied in a 75% propylene carbonate solution.

The radiation-sensitive composition preferably includes an iodonium borate initiator composition that is capable of generating radicals sufficient to initiate polymerization of the radically polymerizable component upon exposure of the composition to imaging radiation. The iodonium borate initiator composition is responsive, for example, to electromagnetic radiation in the near infrared or infrared spectral regions, corresponding to the broad spectral range of from about 600 to about 1500 nm. Preferably, the iodonium borate initiator composition is responsive to infrared or near infrared radiation in the range of from about 600 to about 1300 nm, and more preferably to infrared radiation in the range of from about 700 to about 1200 nm.

The iodonium borate initiator compositions comprise one or more diaryliodonium borate compounds, each of which is represented by the following Structure (I):

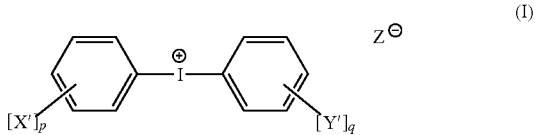

(I)

wherein X' and Y' are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, iso-propyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetrade-cyl)oxy, and various other linear and branched alkyleneoxy-alkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Preferably, X' and Y' are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X' and Y' are independently substituted or unsubstituted alkyl groups having 3 to 6 carbon atoms (and particularly branched alkyl groups having 3 to 6 carbon atoms). Thus, X' and Y' can be the same or different groups, the various X' groups can be the same or different groups, and the various Y' groups can be the same or different groups. Both "symmetric" and "asymmetric" diaryliodonium borate compounds are contemplated by this invention but the "symmetric" compounds are preferred (that is, they have the same groups on both phenyl rings).

In addition, two or more adjacent X' or Y' groups can be combined to form a fused carbocyclic or heterocyclic ring with the respective phenyl groups.

The X' and Y' groups can be in any position on the phenyl rings but preferably they are at the 2- or 4-positions, and more preferably at the 4-position, on either or both phenyl rings.

Despite what type of X' and Y' groups are present in the iodonium cation, the sum of the carbon atoms in the X' and Y' substituents is at least 6, and preferably at least 8, and up to 40 carbon atoms. Thus, in some compounds, one or more X' groups can comprise at least 6 carbon atoms, and Y' does not exist (q is 0). Alternatively, one or more Y' groups can comprise at least 6 carbon atoms, and X' does not exist (p is 0). Moreover, one or more X' groups can comprise less than 6 carbon atoms and one or more Y' groups can comprise less than 6 carbon atoms as long as the sum of the carbon atoms in both X' and Y' is at least 6. Still again, there may be a total of at least 6 carbon atoms on both phenyl rings.

In Structure I, p and q are independently 0 or integers of 1 to 5, provided that either p or q is at least 1. Preferably, both p and q are at least 1, and more preferably, each of p and q is 1. Thus, it is understood that the carbon atoms in the phenyl rings that are not substituted by X' or Y' groups have a hydrogen atom at those ring positions.

$Z^-$ in Structure (I) is an organic anion represented by the following Structure (II):

(II)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Preferably, $R_1$, $R_2$, $R_3$, and $R_4$ are independently substituted or unsubstituted alkyl or aryl groups as defined above, and more preferably, at least 3 of $R_1$, $R_2$, $R_3$, and $R_4$ are the same or different substituted or unsubstituted aryl groups (such as substituted or unsubstituted phenyl groups). Most preferably, all of $R_1$, $R_2$, $R_3$, and $R_4$ are the same or different substituted or unsubstituted aryl groups and most preferably, all of the groups are the same substituted or unsubstituted phenyl group. Most preferably, $Z^-$ is a tetraphenyl borate wherein the phenyl groups are substituted or unsubstituted (and preferably all are unsubstituted).

Representative iodonium borate compounds useful in this invention include but are not limited to, 4-octyloxyphenyl phenyliodonium tetraphenylborate, [4-[(2-hydroxytetrade-cyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)iodonium tetrakis(pentafluorophenyl)borate, and bis(4-t-butylphenyl)iodonium tetrakis(1-imidazolyl)borate. Preferred compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the iodonium borate initiator composition.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999), both of which are incorporated herein by reference. Synthetic Preparation Examples 2-6 provided below before the Examples also demonstrate how representative and preferred compounds can be prepared.

The free radical generating compounds in the initiator composition are generally present in the radiation-sensitive composition in an amount of at least 0.5% and up to and including 30%, and preferably at least 1% and up to and including about 15%, based on composition total solids or total dry weight of the imageable layer. The optimum amount of the various sensitizers may differ for various compounds and the sensitivity of the radiation-sensitive composition that is desired and would be readily apparent to one skilled in the art.

One or more free radical generating compounds generally comprise from about 10 to 100% of the diaryliodonium borate initiator composition. In the coated imageable layers of the imageable elements, these compounds are generally present in an amount of at least 0.01 g/m$^2$ and preferably at from about 0.03 to about 0.3 g/m$^2$.

These compounds may be used alone or in combination with various co-initiators such as heterocyclic mercapto compounds including mercaptotriazoles, mercaptobenzimidazoles, mercaptobenzoxazoles, mercaptobenzothiazoles, mercapto-benzoxadiazoles, mercaptotetrazoles, such as those described for example in U.S. Pat. No. 6,884,568 (Timpe et al.) in amounts of from about 0.5 to about 10 weight % based on the total solids of the radiation-sensitive composition. The mercaptotriazoles are preferred in these combinations of compounds.

Useful IR-sensitive radiation absorbing compounds include carbon blacks and other IR-absorbing pigments and various IR-sensitive dyes ("IR dyes"). Examples of suitable IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squaraine dyes, oxazole dyes, croconine dyes, porphyrin dyes, and any substituted or ionic form of the preceding dye classes. Suitable dyes are also described in U.S. Pat. No. 5,208,135 (Patel et al.) that is incorporated herein by reference. Cyanine dyes may also be useful in combination with a trihalomethyl triazine and an organoboron salt as described for example in U.S. Pat. No. 5,496,903 (Watanabe et al.).

A general description of one class of suitable cyanine dyes is shown by the formula in paragraph [0026] of WO 2004/101280.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

It is also preferred that the IR-sensitive radiation absorbing compound be insoluble in water or fountain solution alone.

The radiation absorbing compound (or sensitizer) can be present in the radiation-sensitive composition in an amount generally of at least 0.1% and up to 30% and preferably from about 2 to about 15%, based on total solids in the composition, that also corresponds to the total dry weight of the imageable layer. Alternatively, the amount can be defined by an absorbance in the range of from about 0.05 to about 3, and preferably from about 0.1 to about 1.5, in the dry film as measured by reflectance UV-visible spectrophotometry. The particular amount needed for this purpose would be readily apparent to one skilled in the art, depending upon the specific compound used.

The polymerizable composition of the invention comprises a polymerizable compound and a polymeric binder comprising poly(alkylene oxide) segments, wherein the polymeric binder is selected from graft copolymers having a main chain polymer and poly(alkylene oxide) [such as poly(ethylene oxide), PEO] side chains or block copolymers having poly (alkylene oxide) together with non-poly(alkylene oxide) blocks. Preferably, the polymers having poly(alkylene oxide) are in used at least in part, in particulate form. The preferred poly(alkylene oxides) used in this invention are poly(ethylene oxide) and poly(propylene oxide).

Preferably the graft and block copolymers are amphiphilic that signifies that they comprise both hydrophilic and hydrophobic segments. Such amphiphilic copolymers also tend to be surface active. The poly(alkylene oxide) segments are generally hydrophilic. Although not bound by any theory, the combination of hydrophobic and hydrophilic segments is considered to be important for enhancing differentiation of the exposed and unexposed areas.

The glass transition temperature $T_g$ of the polymeric binder used in this invention preferably ranges from about 35 to about 220° C., more preferably from about 45 to about 140° C., most preferably from about 50 to about 130° C. The polymeric binder having $T_g$ values in the range specified above is a solid and is preferably non-elastomeric. The polymeric binders may be crosslinked, but are preferably uncrosslinked. The glass transition temperature $T_g$ of the main chain polymer of the graft copolymer and the non-poly(alkylene oxide) block of the block copolymer preferably ranges from 40 to about 220° C., more preferably from about 50 to about 140° C., most preferably from about 60 to about 130° C.

Preferably, the graft and block copolymers have number average molecular weights at least 2,000 and up to 2,000,000. Preferably, the number average molecular weight ($M_n$) of the poly(alkylene oxide) segments or side chains ranges from about 300 to about 10,000, more preferably from about 600 to about 8,000, most preferably from about 750 to about 4,000. When the $M_n$ values are less than about 500, there is insufficient hydrophilic segment to adequately promote developability. However, ink receptivity of the image areas tends to decrease with increasing $M_n$ values of the poly(alkylene oxide) segments that approach 10,000. $M_n$ is generally measured by gel permeation chromatography (GPC) in N,N-dimethylformamide.

The amount of poly(alkylene oxide) segments in the graft copolymers if from about 0.5 to about 60% by weight, preferably from about 2 to about 50% by weight, more preferably from about 5 to about 40% by weight, most preferably from about 5 to about 20% by weight. The amount of poly(alkylene oxide) segments in the block copolymers ranges from about 5 to about 60% by weight, preferably about 10 to about 50% by weight, more preferably about 10 to about 30% by weight. At the low levels of poly(alkylene oxide) segments in the graft and block copolymers, developability tends to decrease, whereas at the high levels, ink receptivity of the image areas tends to decrease.

Other useful polymeric binders have hydrophobic backbones and comprise both of the following a) and b) recurring units, or the b) recurring units alone:

a) recurring units having pendant cyano groups attached directly to the hydrophobic backbone, and b) recurring units having pendant groups comprising poly(alkylene oxide) segments, and preferably at least 50 weight % of all recurring units comprise pendant cyano groups.

These polymeric binders comprise poly(alkylene oxide) segments and preferably poly(ethylene oxide) segments. These polymers can be graft copolymers having a main chain polymer and poly(alkylene oxide) pendant side chains or segments of block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof. Poly(ethylene oxide) and poly(propylene oxide) segments are preferred and poly(ethylene oxide) segments are most preferred.

In some embodiments, the polymeric binders contain only recurring units comprising poly(alkylene oxide) segments, but in other embodiments, the polymeric binders comprise recurring units comprising the poly(alkylene oxide) segments as well as recurring units having pendant cyano groups attached directly to the hydrophobic backbone. By way of example only, such recurring units can comprise pendant groups comprising cyano, cyano-substituted alkylene groups, or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.) that is incorporated herein by reference.

By way of example, such polymeric binders can be formed by polymerization of a combination or mixture of suitable ethylenically unsaturated polymerizable monomers or macromers, such as:

A) acrylonitrile, methacrylonitrile, or a combination thereof,

B) poly(alkylene oxide)esters of acrylic acid or methacrylic acid, such as poly(ethylene glycol)methyl ether acrylate, poly(ethylene glycol)methyl ester methacrylate, or a combination thereof, and C) optionally, monomers such as acrylic acid, methacrylic acid, styrene, hydroxystyrene, acrylate esters, methacrylate esters, acrylamide, methacrylamide, or a combination of such monomers.

The amount of the poly(alkylene oxide) segments in such polymeric binders is from about 0.5 to about 60 weight %, preferably from about 2 to about 50 weight %, more preferably from about 5 to about 40 weight %, and most preferably from 5 to 20 weight %. The amount of (alkylene oxide) segments in the block copolymers is generally from about 5 to about 60 weight %, preferably from about 10 to about 50 weight %, and more preferably from about 10 to about 30 weight %. It is also possible that the polymeric binders having poly(alkylene oxide) side chains are present at least in part in particulate form (that is, discrete particles).

The polymeric binder is present in an amount of from about 10% to about 90% by weight of the radiation sensitive composition, more preferably from about 30% to about 70% by weight. Developability tends to increase with increasing level of poly(alkylene oxide) segments in the polymeric binder. However, at excessively high poly(alkylene oxide) levels, ink receptivity of the image areas tends to decrease.

Preferably, the graft copolymer has a hydrophobic polymer backbone and a plurality of pendant groups represented by:

wherein Q is a bifunctional connecting group; W is selected from the group consisting of a hydrophilic segment and a hydrophobic segment; Y is selected from the group consisting of a hydrophilic segment and a hydrophobic segment; with the proviso that when W is a hydrophilic segment, Y is selected from the group consisting of a hydrophilic segment and a hydrophobic segment; with the further proviso that when W is hydrophobic, Y is a hydrophilic segment.

The term "graft" polymer or copolymer in the context of the present invention refers to a polymer that has as a side chain a group having a molecular weight of at least 200. Such graft copolymers can be obtained, for example, by anionic, cationic, non-ionic, or free radical grafting methods, or they can be obtained by polymerizing or co-polymerizing monomers, which contain such groups.

The graft copolymer preferably comprises repeating (or recurring) units where each unit is represented by the following Structure (III):

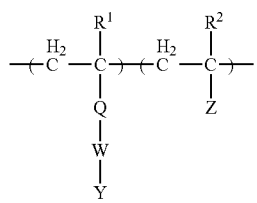

wherein each of $R^1$ and $R^2$ is independently selected from the group consisting of: —H, alkyl, aryl, aralkyl, alkaryl, halogen and cyano;

Q is selected from the group consisting of:

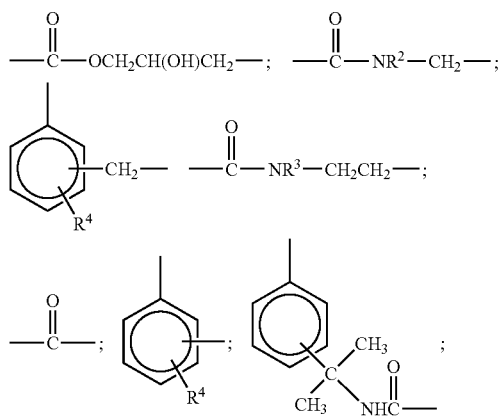

wherein $R^3$ is selected from the group consisting of: —H and alkyl; $R^4$ is selected from the group consisting of: —H, alkyl, halogen, cyano, nitro, alkoxy, alkoxycarbonyl, acyl and a combination thereof;

W is selected from the group consisting of a hydrophilic segment and a hydrophobic segment;

Y is selected from the group consisting of a hydrophilic segment and a hydrophobic segment;

Z is selected from the group consisting of —H, alkyl, halogen, cyano, acyloxy, alkoxy, alkoxycarbonyl, hydroxyalkyloxycarbonyl, acyl, aminocarbonyl, aryl and substituted aryl;

with the proviso that when W is a hydrophilic segment, Y is selected from the group consisting of a hydrophilic segment and a hydrophobic segment, with the further proviso that when W is hydrophobic, Y is a hydrophilic segment.

In one embodiment, the graft copolymer comprises main chain segments that are predominately hydrophobic and branch segments that are predominately hydrophilic.

In a second embodiment, the graft copolymer comprises main chain segments that are predominately hydrophobic and branch segments comprising both hydrophobic and hydrophilic segments.

The hydrophilic segment in W in the graft copolymer is preferably a segment represented by:

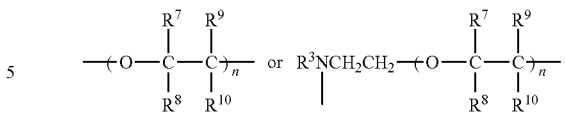

wherein each of $R^7$, $R^8$, $R^9$ and $R^{10}$ is hydrogen; $R^3$ can be —H or alkyl; and n is from about 12 to about 250. The hydrophobic segment in W can be —$R^{12}$—, —O—$R^{12}$—O—, —$R^3$N—$R^{12}$—N$R^3$—, —OOC—$R^{12}$—O— or —COO—$R^2$, wherein each $R^{12}$ can independently be a linear, branched or cyclic alkylene of 6 to 120 carbon atoms, a haloalkylene of 6 to 120 carbon atoms, an arylene of 6 to 120 carbon atoms, an alkarylene of 6 to 120 carbon atoms or an aralkylene of 6 to 120 carbon atoms; and $R^3$ can be —H or alkyl.

The hydrophilic segment in Y can be —H, —$R^{15}$, —OH, —$OR^{16}$, —COOH, —COOR$^{16}$, —O$_2$CR$^{16}$, a segment represented by:

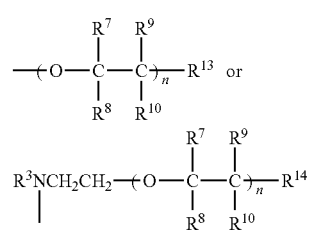

wherein each of $R^7$, $R^8$, $R^9$ and $R^{10}$ is hydrogen; $R^3$ can be —H or alkyl; wherein each $R^{13}$, $R^{14}$, $R^{15}$ and $R^{16}$ can independently be —H or alkyl of 1-5 carbon atoms and n is from about 12 to about 250. The hydrophobic segment in Y can be a linear, branched or cyclic alkyl of 6-120 carbon atoms, a haloalkyl of 6 to 120 carbon atoms, an aryl of 6 to 120 carbon atoms, an alkaryl of 6-120 carbon atoms, an aralkyl of 6-120 carbon atoms, —OR$^{17}$, —COOR$^{17}$ or —O$_2$CR$^{17}$, wherein $R^{17}$ is an alkyl of 6-20 carbon atoms.

In a preferred embodiment, the graft copolymer comprises repeating units represented by the following Structure (IV):

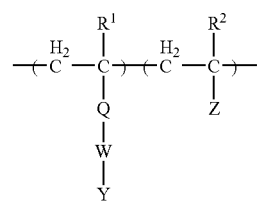

wherein each of $R^1$ and $R^2$ can independently be —H, alkyl, aryl, aralkyl, alkaryl, halogen or cyano;

wherein Q can be one of:

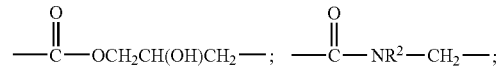

-continued

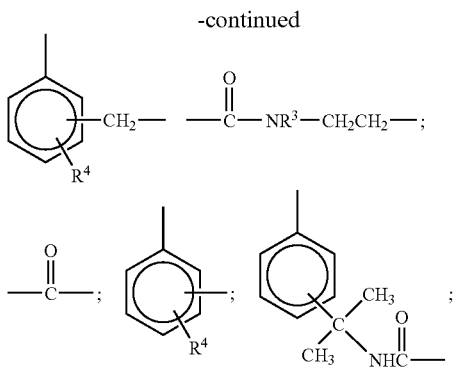

and wherein $R^3$ can be —H or alkyl; $R^4$ can independently be —H, alkyl, halogen, cyano, nitro, alkoxy, alkoxycarbonyl, acyl or a combination thereof, W is selected from the group consisting of: a hydrophilic segment and a hydrophobic segment;

Y is selected from the group consisting of: a hydrophilic segment and a hydrophobic segment;

Z is selected from the group consisting of —H, alkyl, halogen, cyano, acyloxy, alkoxy, alkoxycarbonyl, hydroxyalkyloxycarbonyl, acyl, aminocarbonyl, aryl and substituted aryl, where the substituent in the above substituted aryl can be alkyl, halogen, cyano, alkoxy or alkoxycarbonyl, and the alkyl group is preferably an alkyl of 1 to 22 carbon atoms;

with the proviso that when W is a hydrophilic segment, Y is selected from the group consisting of a hydrophilic segment and a hydrophobic segment, with the further proviso that when W is hydrophobic, Y is a hydrophilic segment.

The segment W can be a hydrophilic segment or a hydrophobic segment, wherein the hydrophilic segment can be a segment represented by:

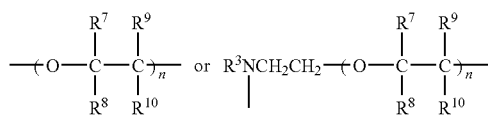

wherein each of $R^7$, $R^8$, $R^9$ and $R^{10}$ is hydrogen; $R^3$ can be —H or alkyl; and n is from about 12 to about 250. The hydrophobic segment can be —$R^{12}$—, —O—$R^{12}$—O—, —$R^3$N—$R^{12}$—N$R^3$—, OOC—$R^{12}$—O—, or —COO—$R^{12}$—O—, wherein each $R^{12}$ can independently be a linear, branched or cyclic alkylene of 6 to 120 carbon atoms, a haloalkylene of 6 to 120 carbon atoms, an arylene of 6 to 120 carbon atoms, an alkarylene of 6 to 120 carbon atoms or an aralkylene of 6 to 120 carbon atoms; $R^3$ can be —H or alkyl.

Y can be a hydrophilic segment or a hydrophobic segment, wherein the hydrophilic segment can be —H, —$R^{15}$, —OH, —$OR^{16}$, —COOH, —$COOR^{16}$, —$O_2CR^{16}$, a segment represented by:

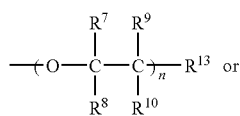

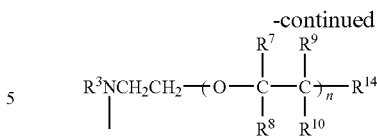

wherein each of $R^7$, $R^8$, $R^9$ and $R^{10}$ is hydrogen; $R^3$ can be —H or alkyl; wherein each $R^{13}$, $R^{14}$, $R^{15}$ and $R^{16}$ can be —H or alkyl of 1 to 5 carbon atoms and n is from about 12 to about 250. The hydrophobic segment in Y can be a linear, branched or cyclic alkyl of 6-120 carbon atoms, a haloalkyl of 6 to 120 carbon atoms, an aryl of 6 to 120 carbon atoms, an alkaryl of 6 to 120 carbon atoms, an aralkyl of 6 to 120 carbon atoms, —$OR^7$, —$COOR^{17}$ or —$O_2CR^{17}$, wherein $R^{17}$ can be an alkyl of 6 to 20 carbon atoms.

In another preferred embodiment, the segment W—Y can be represented by:

wherein n is from about 12 to about 75. In this preferred embodiment, the graft copolymer has, for example, repeating units represented by the following Structure (V):

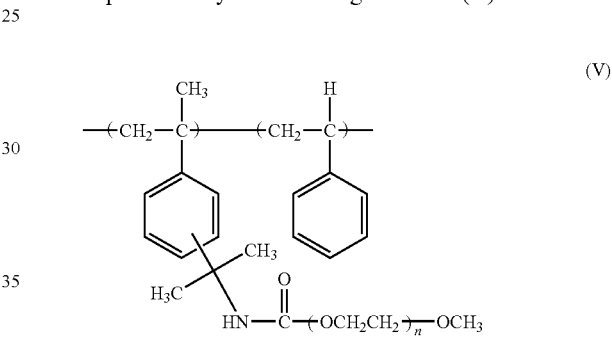

wherein n is from about 12 to about 75. More preferably, n has an average value of about 45.

In another preferred embodiment, the graft copolymer comprises repeating units represented by the following Structure (VI):

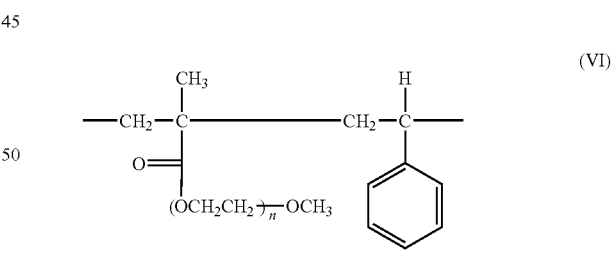

wherein n is from about 12 to about 75, more preferably, n has an average value of about 45.

In one preferred embodiment, the main chain polymer of the graft copolymer of the invention comprises monomer units that are selected from the group consisting of acrylate esters, methacrylate esters, styrene, acrylic acid, methacrylic acid, and combinations thereof. More preferably, the monomer units are methyl methacrylate, allyl methacrylate, or combinations thereof.

The graft copolymer having hydrophobic and/or hydrophilic segments may be prepared by a process comprising the steps of:

(A) contacting the following components to produce a polymerizable graft copolymer:
(i) a compound represented by:

wherein W is selected from the group consisting of a hydrophilic segment and a hydrophobic segment and Y is selected from the group consisting of a hydrophilic segment and a hydrophobic segment, with the proviso that when W is a hydrophilic segment, Y is selected from the group consisting of a hydrophilic segment and a hydrophobic segment, with the further proviso that when W is hydrophobic, Y is a hydrophilic segment, and (ii) a polymerizable monomer selected from the group consisting of compounds represented by:

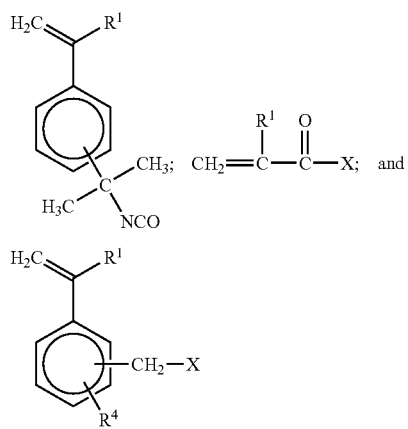

wherein each $R^1$ is independently selected from the group consisting of: —H, alkyl, aryl, aralkyl, alkaryl, halogen and cyano; $R^4$ is selected from the group consisting of: —H, alkyl, halogen, cyano, nitro, alkoxy, alkoxycarbonyl, acyl, and a combination thereof; and X is glycidyloxy or a leaving group selected from the group consisting of: halogen, alkoxy and aryloxy, to produce a polymerizable graft monomer; and (B) copolymerizing the polymerizable graft monomer and one or more comonomers at a temperature and for a period of time sufficient to produce the graft copolymer. When necessary, the contacting step takes place in the presence of a catalyst.

Preferably, the comonomer is one or more of the following: styrene, substituted styrene, α-methylstyrene, acrylate ester, methacrylate ester, acrylonitrile, acrylamide, methacrylamide, vinyl halide, vinyl ester, vinyl ether and an alpha-olefin.

The preferred polymerizable monomer can be any monomer that is capable of reacting with H—W—Y and include polymerizable monomers, such as, m-isopropenyl-α,α-dimethylbenzyl isocyanate, acryloyl chloride and methacryloyl chloride. The reaction is typically carried out in the presence of a catalyst, which is preferably a base, a tin compound or a mixture thereof. In a reaction that admits to an acid catalyst, an acid catalyst such as a Lewis or protic acid may be used.

Preferably, the compounds represented by the formula H—W—Y can be one or more of compounds represented by:

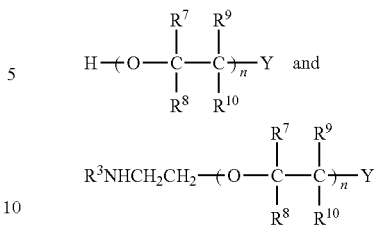

wherein each of $R^7$, $R^8$, $R^9$ and $R^{10}$ is hydrogen; $R^3$ can be —H or alkyl; Y can be alkyl, acyloxy, alkoxy or carboxylate; and n is from about 12 to about 250.

The graft copolymer is typically obtained by a free-radical copolymerization of the graft monomer and the comonomer, preferably at a comonomer to graft monomer weight ratio of from about 99:1 to about 45:55.

Alternatively, the graft copolymer can be prepared by first copolymerizing a polymerizable monomer according to the present invention with one or more comonomers at a temperature and for a period of time sufficient to produce a graftable copolymer and thereafter grafting the group —W—Y onto the graftable copolymer. Such grafting can be achieved by contacting in the presence of a catalyst the above graftable copolymer and a compound represented by:

wherein W can be a hydrophilic segment or a hydrophobic segment and Y can be a hydrophilic segment and a hydrophobic segment, with the proviso that when W is a hydrophilic segment, Y is either a hydrophilic segment or a hydrophobic segment, with the further proviso that when W is hydrophobic, Y is a hydrophilic segment.

The graft copolymers of the present invention may be prepared by reacting hydroxy-functional or amine functional polyethylene glycol monoalkyl ethers with polymers having co-reactive groups, including acid chloride, isocyanate and anhydride groups. The side chains may further comprise a hydrophobic segment between the PEO segment and the main chain, and a hydrophobic segment at the terminus of the PEO side chains. Other methods of preparation of the graft copolymers of the present invention include the methods described in U.S. Pat. No. 6,582,882 (noted above).

The main chain polymer of the graft copolymers may be an addition polymer or a condensation polymer. Addition polymers are preferably prepared from acrylate and methacrylate esters, acrylic and methacrylic acid, acrylamides and methacrylamides, acrylonitrile and methacrylonitrile, styrene, vinyl phenol and combinations thereof. More preferably, addition polymers are prepared from styrene, methyl methacrylate, allyl acrylate and methacrylate, acrylic and methacrylic acid, and combinations thereof. Preferably, condensation polymers are polyurethanes, epoxy resins, polyesters, polyamides and phenolic polymers, including phenol/formaldehyde and pyrogallol/acetone polymers.

The polymeric binder may also comprise a mixture of graft copolymers each comprising a main chain polymer and polyethylene oxide side chains. The main chain polymer of each graft copolymer is independently selected from an addition polymer or a condensation polymer. Preferable addition polymers are homopolymers and copolymers of monomers independently selected from the group consisting of acrylate and methacrylate esters, including allyl acrylate and methacrylate, acrylic and methacrylic acid, acrylamides and methacrylamides, acrylonitriles and methacrylonitriles, styrene, vinyl phenol and combinations thereof. Preferred condensation polymers are independently selected from polyurethanes, epoxy resins, polyesters, polyamides or phenolic polymers, including phenol/formaldehyde and pyrogallol/acetone condensation polymers.

The block copolymers can be made by conventional procedures, including anionic, cationic, and free radical polymerization. Atom transfer radical polymerization (ATRP) and reversible addition-fragmentation chain transfer (RAFT) polymerization can be particularly convenient methods. PEO block copolymers are conveniently prepared by ATRP methods, as described by M. Ranger, et al. *Journal of Polymer Science, Part A: Polymer Chemistry*, Vol. 39 (2001), pp. 3861-74.

The at least one non-polyethylene oxide block of the block copolymers may be an addition polymer or a condensation polymer. The addition polymers are preferably homopolymers or copolymers of monomers selected from acrylate or methacrylate esters, including allyl acrylate or methacrylate, acrylic or methacrylic acid, acrylamides or methacrylamides, acrylonitrile or methacrylonitrile, styrene, or vinyl phenol. Preferred condensation polymers are polyurethanes, epoxy resins, polyesters, polyamides and polyureas.

In one preferred embodiment of the invention, the at least one non-polyethylene oxide block of the block copolymers does not comprise poly(alkylene oxide) segments. In another preferred embodiment, the at least one non-poly(ethylene oxide) block comprises homopolymers or copolymers of monomers selected from the group consisting of methyl methacrylate, allyl acrylate and methacrylate, acrylic and methacrylic acid, styrene, vinyl phenol and combinations thereof.

The polymeric binder may comprise a mixture of block copolymers each comprising at least one poly(alkylene oxide) block and at least one non-poly(alkylene oxide) block, as described above. In addition, the polymeric binder may comprise a mixture of graft and block copolymers, as described above.

In another embodiment of the invention, the polymerizable composition comprises discrete particles of polymeric binder (s). The particles may include a mixture of copolymers, which contain various possible combinations of monomeric units. Preferably, the discrete particles are particles of the polymeric binder that are suspended in the polymerizable composition. In a particularly preferred embodiment, the polymeric binder comprises at least one graft copolymer. The diameter of the particles in the suspension may range from about 60 nm to about 300 nm in diameter. The presence of such discrete particles tends to promote developability of the non-exposed areas.

The imageable element can include a variety of other components for various purposes including but not limited to, dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones). It is particularly useful that the imageable element comprise a colorant to allow visualization of the written image that is insoluble in water or a fountain solution (either neat or seasoned) alone. One useful colorant of this type is Blue 63 that is a leuco dye that is described and used in the Examples below. Other useful colorants and precursors thereof such as the phthalide and fluoran leuco dyes having a lactone skeleton with an acid dissociation property, are described in U.S. Pat. No. 6,858,374 (Yanaka) that is incorporated herein by reference.

In addition, the imageable layer can comprise a nonionic phosphate acrylate having a molecular weight of at least 250 and 2 or more ethylene oxide units. By "nonionic" we mean that the phosphate acrylates not only are neutral in charge but they have no internal positive or negative charges. Thus, they are not internal salts or salts formed with an external cation or anion. Moreover, by "phosphate acrylate" we also meant to include "phosphate methacrylates" and other derivatives having substituents on the vinyl group in the acrylate moiety. Each phosphate moiety is connected to an acrylate moiety by an alkyleneoxy chain, that is a -(alkylene-O)$_m$— chain composed of at least one alkyleneoxy unit, in which the alkylene moiety has 2 to 6 carbon atoms and can be either linear or branched and m is 1 to 10. Preferably, the alkyleneoxy chain comprises ethyleneoxy units, and m is from 2 to 8 and more preferably, m is from 3 to 6. The alkyleneoxy chains in a specific compound can be the same or different in length and have the same or different alkylene group.

More particularly, the nonionic phosphate acrylates useful in this invention can be represented by the following Structure (VII):

$$P(=O)(OH)_n(R)_{3-n} \qquad (VII)$$

wherein the R groups are independently the same or different groups represented by the following Structure (VIII):

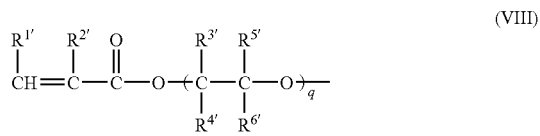

wherein $R^{1'}$ and $R^{2'}$ are independently hydrogen, or a halo group (such as fluoro, chloro, bromo, or iodo) or a substituted or unsubstituted alkyl group having 1 to 4 carbon atoms (such as methyl, chloromethyl, ethyl, isopropyl, n-butyl, and t-butyl). Preferably, $R^{1'}$ and $R^{2'}$ are independently hydrogen, methyl, or chloro, and more preferably, they are independently hydrogen or methyl.

$R^{3'}$ through $R^{6'}$ are independently hydrogen or a substituted or unsubstituted alkyl group having 1 to 5 carbon atoms (such as methyl, chloromethyl, hydroxymethyl, ethyl, iso-propyl, n-butyl, t-butyl, and n-pentyl). Preferably, $R^{3'}$ through $R^{6'}$ are independently hydrogen or substituted or unsubstituted methyl or ethyl groups, and more preferably, they are independently hydrogen or unsubstituted methyl groups.

Also, in Structure VII, n is 1 or 2 and is preferably 2.

In Structure VIII, q is 1 to 10, preferably, 2 to 8, and more preferably 3 to 6.

Representative nonionic phosphate acrylates include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan) that is shown below, a phosphate of caprolactone modified 2-hydroxyethyl methacrylate that is available as Kayamer PM-21 (Nippon Kayaku, Japan) that is also shown below, and an ethylene glycol methacrylate phosphate with 4-5 ethoxy groups that is available as Phosmer PE from Uni-Chemical Co., Ltd. (Japan) that is also shown below. Other useful nonionic phosphate acrylates are also shown below.

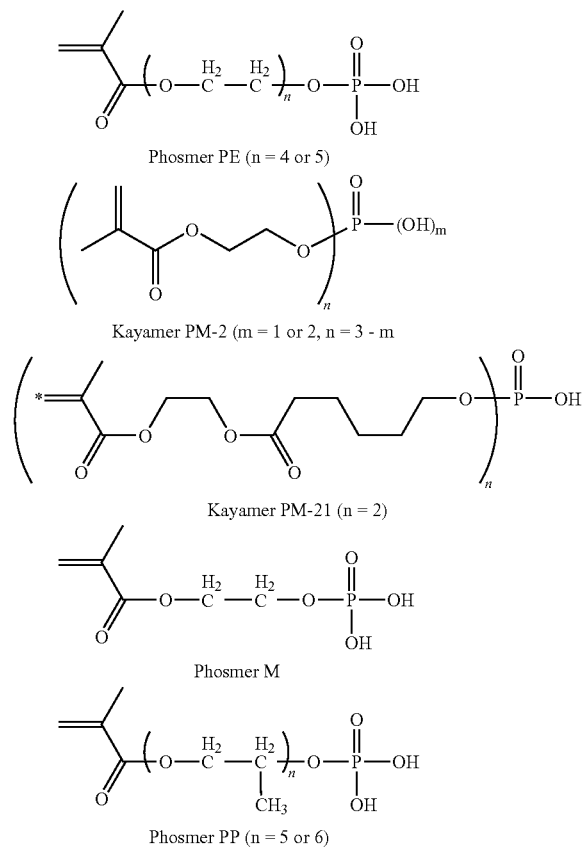

The nonionic phosphate acrylate can be present in the radiation-sensitive composition in an amount of at least 0.6 and up to 20% and preferably from about 0.9 to about 10%, by weight of the total solids. In the dry imageable layers of the imageable elements, the amount of nonionic phosphate acrylate can be present in an amount of at least 8 mg/mm² and up to 300 mg/m² and preferably at from about 10 to about 150 mg/m².

The substrate of the imageable element is typically an aluminum sheet. However, other materials that are commonly known to those skilled in the art can also be used. Suitable substrates include any sheet material conventionally used to prepare lithographic printing plates, including metals such as aluminum sheets; paper; paper coated on one or both sides with an α-olefin polymer such as polyethylene; films such as cellulose acetate film, polyvinyl acetal film, polystyrene film polypropylene film, polyester film such as polyethylene terephthalate film, polyamide film, polyamide film, nitrocellulose film, polycarbonate film, polyvinyl chloride film; composite films such as polyester, polypropylene or polystyrene film coated with polyethylene film; metallized paper or films; metal/paper laminates and the like.

The surface of plastic films may be treated using the surface treatment techniques known in the art to improve adhesion between the substrate and organic coatings, such as by coating subbing layers onto the plastic films.

A preferred substrate is an aluminum sheet. The surface of the aluminum sheet may be treated with metal finishing techniques known in the art including physical roughening (for example brush graining), electrochemical roughening or graining, chemical roughening or graining, anodizing, and silicate sealing and the like. If the surface is roughened, the average roughness (Ra) is preferably in the range from about 0.1 to about 0.8 μm, and more preferably in the range from about 0.1 to about 0.6 μm. The preferred thickness of the aluminum sheet is in the range from about 0.005 inch to about 0.020 inch. The preferred substrate is electrochemically-grained and anodized aluminum, such as commonly used for lithographic printing plates.

Anodic pore size for sulfuric acid anodization is typically less than 20 nm whereas anodic pore size for phosphoric acid anodization is typically greater than 30 nm. The use of large anodic pore substrates that are phosphoric acid anodized is preferred over sulfuric acid-anodized substrates. Other conventional anodization methods can also be used in the preparation of the anodized substrate of the present invention, including particularly those that produce an anodic pore size larger than anodic pore size produced by sulfuric acid anodization. Thus, the preferred substrate is a grained, phosphoric acid anodized aluminum-containing substrate.

An interlayer can also be formed on the grained and anodized metal substrate by treatment with, for example, silicates, dextrine, hexafluorosilicic acid, sodium phosphate solutions containing sodium fluoride, poly(acrylic acid), poly(vinyl phosphonic acid), or water-soluble diazo resins.

The polymeric binder can be applied onto the substrate as a solution or dispersion in the coating liquid of the image-forming layer by a suitable coating method. Illustrative of such a method is dissolving the graft copolymer in an organic water immiscible solvent, dispersing the resulting solution in an aqueous medium, applying the resulting dispersion onto a substrate and thereafter removing the solvent by evaporation. After proper drying, the coating weight of the layer is preferably in the range of from about 0.2 to about 5.0 g/m², and more preferably in the range of from about 0.7 to about 2.5 g/m².

Imaging

During use, the imageable element is exposed to a suitable source of radiation such as near-infrared, or infrared radiation, depending upon the radiation absorbing compound present in the radiation-sensitive composition, at a wavelength of from about 600 to about 1500 nm and preferably at from about 700 to about 1200 nm. The laser used to expose the imageable element is preferably a diode laser, because of the reliability and low maintenance of diode laser systems, but other lasers such as gas or solid state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging can be carried out generally at an imaging energy of at least 20 mJ/cm² and up to and including 500 mJ/cm², preferably at from about 50 to about 300 mJ/cm².

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

The imageable element may further comprise an overlying layer. One possible function of the overlying layer is to serve as an oxygen barrier layer by comprising an oxygen-impermeable compound. The term "oxygen-impermeable compound" is intended to mean a compound that prevents the diffusion of oxygen from the atmosphere into the layer during the lifetime of the radicals generated by IR exposure. The overlying layer should be soluble, dispersible or at least permeable to the lithographic printing ink, water or fountain solution, or both. Other possible functions of an overlying layer include:

(1) to prevent damage, such as scratching, of the surface layer during handling prior to imagewise exposure;
(2) to prevent damage to the surface of the imagewise exposed areas, for example, by over-exposure which could result in partial ablation; and
(3) to facilitate developability of the unexposed areas.

Development

Development does not involve a separate development step. The imageable element is directly mounted on-press, wherein the non-exposed areas are removed by the joint action of a lithographic printing ink and either a fountain solution or water, thereby avoiding a separate development step.

For example, the imageable element of this invention is imagewise exposed to provide an imaged element with an imaged layer containing both exposed regions and non-exposed regions. Prior or subsequently to the exposure step, the imageable element is mounted onto a lithographic printing press. Thus, both exposure and development can occur on-press, or imagewise exposure can occur off-press and development on-press. The imagewise exposure used in these methods can be preferably carried out by an IR laser at a wavelength of from about 700 to about 1200 nm.

In some embodiments, once on-press, the imaged layer is contacted on-press with water or a fountain solution but not a lithographic printing ink for sufficient time to swell the non-exposed regions of the imaged layer but leaving the non-exposed regions of the imaged layer substantially intact on the substrate. The swollen non-exposed regions are then contacted with both water or fountain solution and a lithographic printing ink to substantially remove the non-exposed regions only. This can occur without physical removal of the non-exposed regions from the substrate. Simultaneously, or subsequently, the imaged element is then used to print images on receiver materials (such as sheets of paper, cardboard, or fabric).

This invention also provides a planographic printing method in which the imageable element is imagewise exposed (preferably, on-press) to provide an imaged element with an imaged layer containing both exposed regions and non-exposed regions. While this imaged element is on-press, the non-exposed regions of the imaged layer are removed by the joint action of a lithographic printing ink and either water or a fountain solution. By "joint action", we mean that the water or fountain solution can be supplied first and then the lithographic printing ink is supplied to the imaged element. Alternatively, the fountain solution or water and lithographic printing ink can be supplied simultaneously. Still again, the lithographic printing ink can be supplied first, and then the fountain solution or water. Additional lithographic printing ink is then supplied with either water or a fountain solution to provide printed images on receiver materials.

Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

Following development, a postbake may optionally be used to increase press life.

EXAMPLES

The invention is further described in the following examples, which are intended to be illustrative and not limiting. The following components were used in the examples and unless indicated, the components are available from Aldrich Chemical Company (Milwaukee, Wis.). Blue 63 is a leuco dye color former (10% in tetrahydrofuran) that was obtained from Yamamoto Chemicals, Inc. (Japan) and has the following structure:

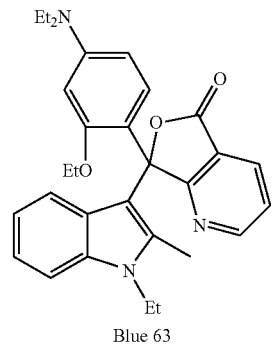

Blue 63

Byk® 336 is a 25% (weight) solution of a modified dimethyl polysiloxane copolymer in xylene/methoxypropyl acetate that was obtained from Byk Chemie (Wallingford, Conn.).

Crawford Pantone 340 Green printing ink was obtained from Crawford (Denver, Colo.).

Emerald JRZ acid fountain solution and ARS-ML alcohol substitute were obtained from Anchor (Orange Park, Fla.).

Equinox process black ink, #15, was obtained from Graphic Ink Company (Salt Lake City, Utah).

Initiator A was prepared as follows. Sodium tetraphenylborate (45 g) was dissolved in n-propanol (100 g) and water (160 g) in a 500 ml beaker marked as container A. Bis(4-t-butylphenyl)iodonium-hexafluorophosphate (67.3 g, Sanwa Chemical Co., Ltd.) was dissolved in n-propanol (500 g) and water (800 g) in a 2000 ml beaker marked as container B. The solution in the container A was slowly (in about 15 minutes) added to the solution in the container B while severely stirring by a Silverson L4R. A white precipitate was formed and the mixture was stored in a refrigerator for 6 hours. After a first filtration, the white solid was collected and washed with 400 ml of water. The product obtained from a second filtration was dried under ambient temperature overnight and then at 40° C. in an oven for 4 hours to obtain 84.2 g of white solid. $^1$H NMR spectrum (in DMSO-$d_6$) exhibited chemical shifts at the following values δ [ppm]: 1.31 (s, 18H), 6.72 (t, 4H), 6.98 (t, 8H), 7.22 (br, 8H), 7.59 (d, 4H) and 8.18 (d, 4H).

Irgacure® 250 is a 75 wt. % solution of iodonium, (4-methoxyphenyl)[4-(2-methylpropyl)phenyl]-, hexafluorophosphate in propylene carbonate that was obtained from Ciba Specialty Chemicals (Tarrytown, N.Y.), and is used in the examples as a 50% solution propylene carbonate.

Irganox® 1035 is a 5% solution of thiodiethylene bis(3,5-di-tert-butyl-4-hydroxyhydrocinnamate) in 2-butanone that was obtained from Ciba Specialty Chemicals Company (Tarrytown, N.Y.).

IR Dye 1 was obtained from Eastman Kodak Company and is represented by the following formula:

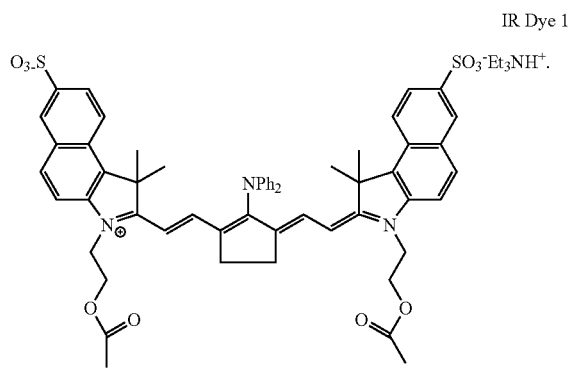

IR Dye 1

Klucel® E is a hydroxypropyl cellulose thickener used as a 5 wt. % aqueous solution that was obtained from Hercules (Heverlee, Belgium).

Mercapto-3-triazole represents mercapto-3-triazole-1H, 2,4 that was obtained from PCAS (Longjumeau, France).

NaBPh$_4$ represents sodium tetraphenylborate.

Oligomer A was a urethane acrylate that was prepared by reacting Desmodur N 100 with hydroxyethyl acrylate and pentaerythritol triacrylate (80% by weight in MEK).

Polymer A was prepared as follows. A solution of PEGMA (20 g) dissolved in a mixture of deionized water (74.8 g) and n-propanol (241.4 g), was charged into a 1000 ml four-necked flask, and was heated slowly to slight reflux (76° C.) under $N_2$ atmosphere. A pre-mixture of styrene (20 g), acrylonitrile (70 g) and Vazo-64 (0.7 g) was added over a 2-hour period. Six hours later, another aliquot of Vazo-64 (0.5 g) was added. The temperature was raised to 80° C. Subsequently, two more aliquots of Vazo-64 (0.35 g each) were added over a period of 6 hours. After reaction for a total of 19 hours, the conversion to copolymer was >98% based on a determination of percent non-volatiles. The weight ratio of PEGMA/styrene/-acrylonitrile was 10:20:70 and n-propanol/water ratio was 76:24. The residual acrylonitrile in solution was 0.5% based on determination by $^1$H-NMR. It is added to a formulation used in the examples as a 24% solution.

Sartomer 399 ("SR399") represents dipentaerythritol pentaacrylate that was obtained from Sartomer Company, Inc. (Exton, Pa.) and it is added to a formulation as an 40 wt. % solution in 2-butanone.

Varn Litho Etch 142W and PAR alcohol replacement were obtained from Varn International (Addison, Ill.).

Imageable Element A was prepared as follows. An imageable layer formulation was prepared by dissolving Polymer A (3.56 g), Oligomer A (1.21 g), IR Dye 1 (0.16 g), mercapto-3-triazole (0.11 g), SR-399 (2.43 g), Klucel® E (3.89 g), NaBPh$_4$ (0.08 g), Byk® 336 (0.35 g), Blue 63 (1.79 g), 2,4-dihydroxybenzophenone (0.09 g), Irganox® 1035 (0.19 g), and Irgacure® 250 (0.37 g) in n-propanol (63.05 g), water (5.38 g), and 2-butanone (17.34 g). A mechanically-grained and phosphoric acid anodized aluminum substrate that had been post-treated with poly(acrylic acid) was coated with this formulation to provide a dry coating weight of about 0.88 g/m$^2$ when properly dried at 77° C. for about 2 minutes on a rotating drum.

Imageable Element B was a Thermal Direct processless (on-press developable) lithographic printing plate, as supplied by Eastman Kodak Company.

Imageable Element C was prepared as follows: An imageable layer formulation was prepared by dissolving Polymer A (3.55 g), Oligomer A (1.21 g), IR Dye 1 (0.26 g), mercapto-3-triazole (0.11 g), SR399 (2.54 g), Klucel® E (3.89 g), Blue 63 (1.79 G), 2,4-dihydroxybenzophenone (0.09 g), Irganox® 1035 (0.19 g), Byk® 336 (0.35 g), and Initiator A (0.27 g) in n-propanol (63.25 g), water (5.38 g), and 2-butanone (17.34 g). A mechanically-grained and phosphoric acid anodized aluminum substrate that had been post-treated with poly (acrylic acid) was coated with this formulation to provide a dry coating weight of about 0.88 g/m$^2$ when properly dried at 77° C. for about 2 minutes on a rotating drum.

Each of Imageable Elements A, B and C were placed on a CREO® Trendsetter 3244x imagesetter and exposed to an 830 nm IR laser, at an exposure of 300 mJ/cm$^2$ for Element A and 150 mJ/cm$^2$ for Elements B and C to provide printing plates A, B, and C. The various imaged and developed printing plates from Elements A, B, and C are respectively identified as "A", "B", or "C" in the images of FIGS. 1-9.

Test One:

For this test, printing plates A, B, and C were mounted directly on a Komori printing press charged with Equinox process black lithographic ink and a fountain solution containing Varn Litho Etch 142W at 3 ounces/gallon (22.5 g/liter) and PAR alcohol replacement at 3 ounces/gallon (22.5 g/liter).

Example 1

The Komori printing press was operated with the fountain-feed system engaged with the printing plate cylinder for 20 revolutions, followed by both the ink-feed system and the fountain-feed system engaged with the printing plate cylinder for another 20 revolutions. FIG. 1 shows that complete development was achieved for printing plates A, B, and C, on-press.

Example 2

Figure 2:
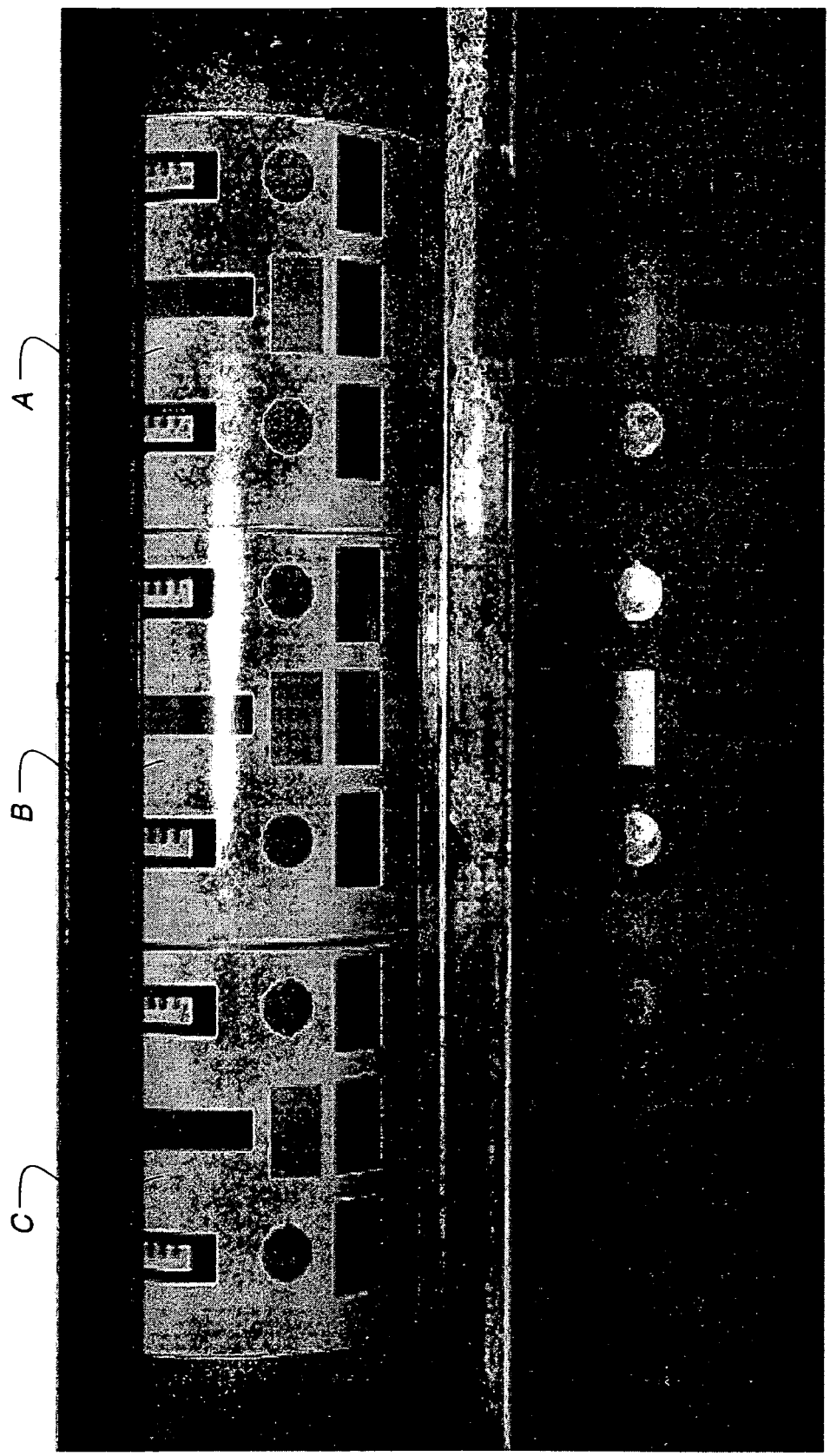
FIG. 2 is a black-and-white image showing development results described in Example 2 below.

The Komori printing press was operated with the ink-feed system engaged with the printing plate cylinder for 20 revolutions, followed by both the ink-feed system and the fountain-feed system engaged with the printing plate cylinder for another 20 revolutions. FIG. 2 shows that complete development was achieved for printing plates A, B, and C, on-press.

Example 3

The Komori printing press was operated with both the ink-feed system and fountain-feed system engaged with the printing plate cylinder for 20 revolutions. Once again, complete development was achieved with printing plates A, B, and C, on-press Example 4

Figure 3:
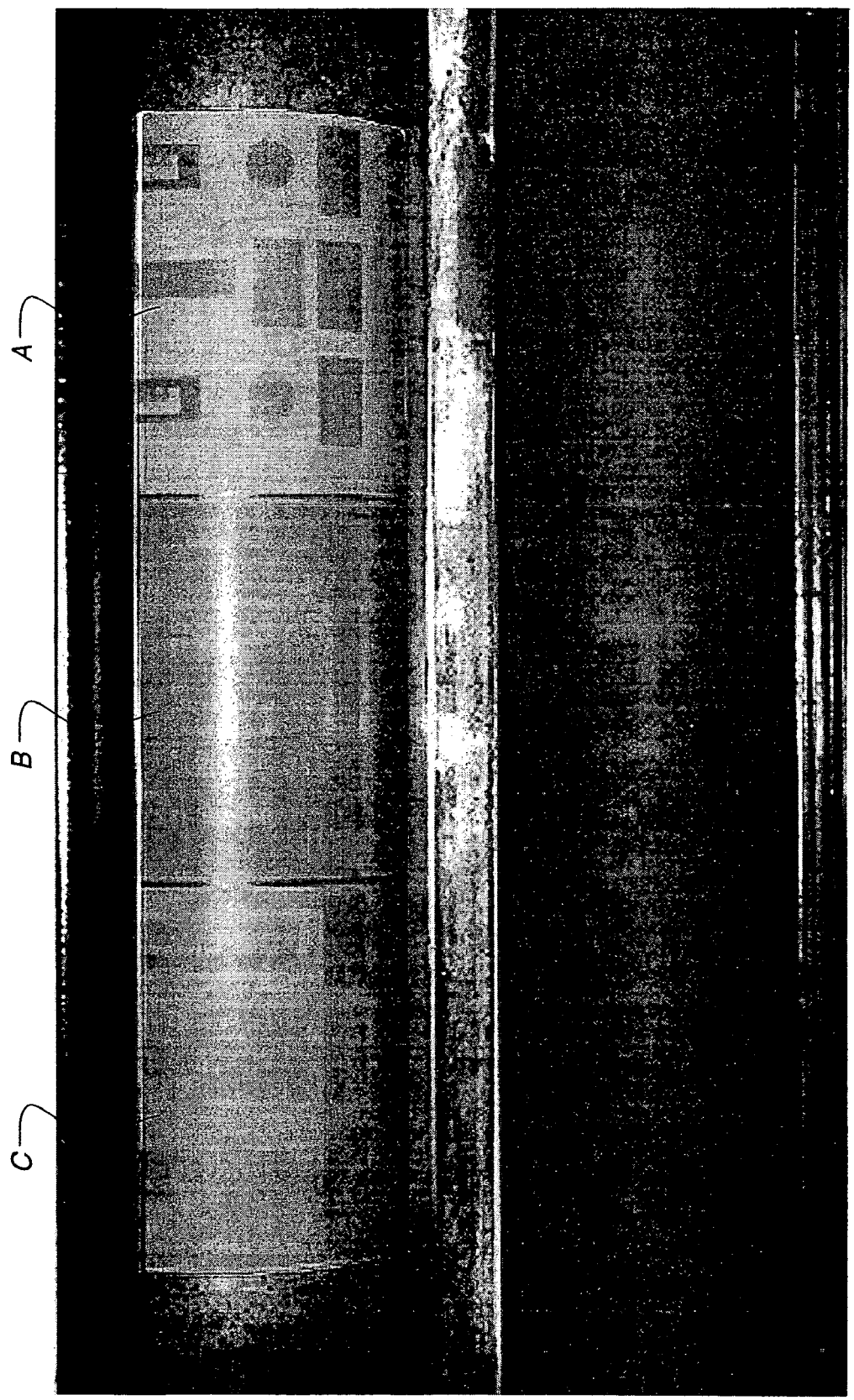
FIGS. 3 and 4 are black-and-white images showing development results described in Example 4 below.

The Komori printing press was operated with the fountain-feed system engaged with the printing plate cylinder for 20 revolutions. FIG. 3 shows that printing plate B was not developed, printing plate C was only partially developed, but printing plate A was fully developed.

Figure 4:
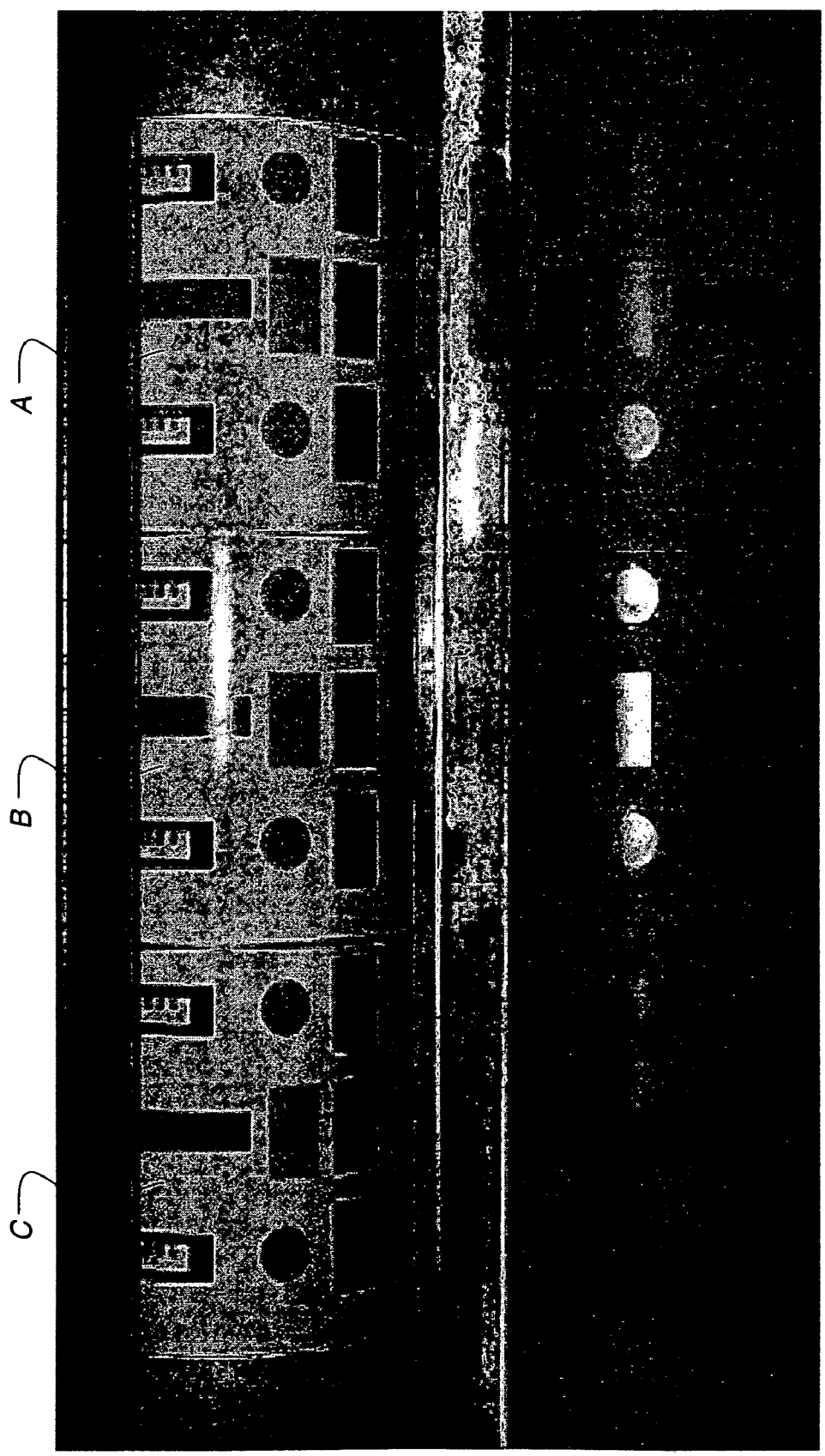

Paper was then feed through the printing press while both the ink-feed and fountain-feed systems were engaged. FIG. 4 illustrates that complete development was achieved for all printing plates A-C after 25 sheets of paper had been used for impressions.

Example 5

Figure 5:
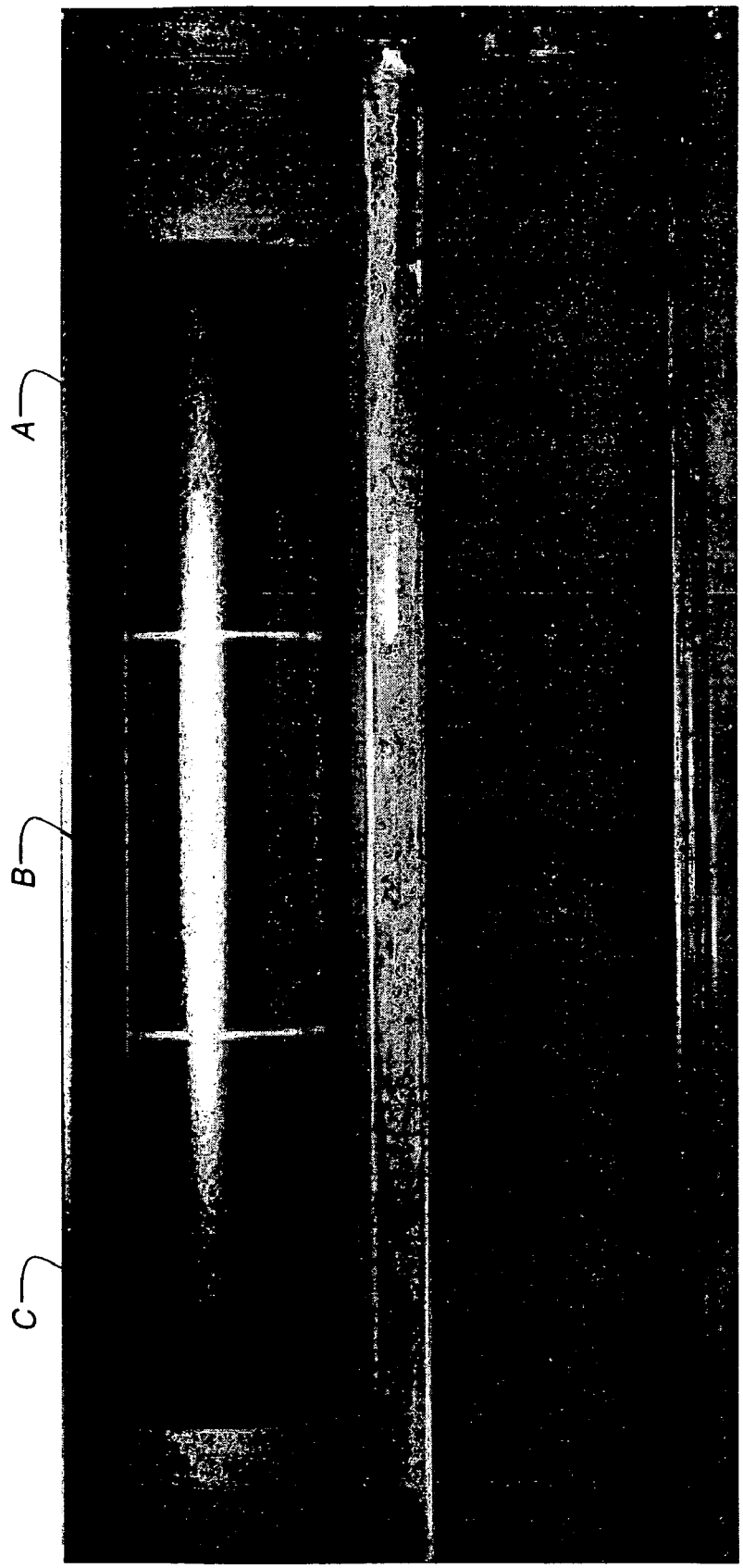
FIGS. 5 and 6 are black-and-white images showing development results described in Example 5 below.

The Komori printing press was operated with the ink-feed system only engaged with the printing plate cylinder for 20 cylinder revolutions. FIG. 5 shows that none of printing plates A, B, and C were developed, on-press.

Figure 6:

Paper was then fed through the printing press while both the ink-feed and fountain-feed systems were engaged. FIG. 6 shows that printing plate B was not developed, printing plate C was only partially developed, and printing plate A was fully developed.

Test Two:

For this test, the imaged elements (printing plates) were mounted directly on a Komori printing press charged with Crawford green ink and a fountain solution containing Emerald JRZ at 2.5 ounces/gallon and ARS-ML alcohol substitute at 3 ounces/gallon.

Example 6

The Komori printing press was operated with the fountain-feed system engaged with the printing plate cylinder for 20 cylinder revolutions, followed by both the ink-feed system and the fountain-feed system engaged with the printing cylinder for another 20 revolutions. Complete on-press development of printing plates A, B, and C was achieved.

Example 7

Figure 7:
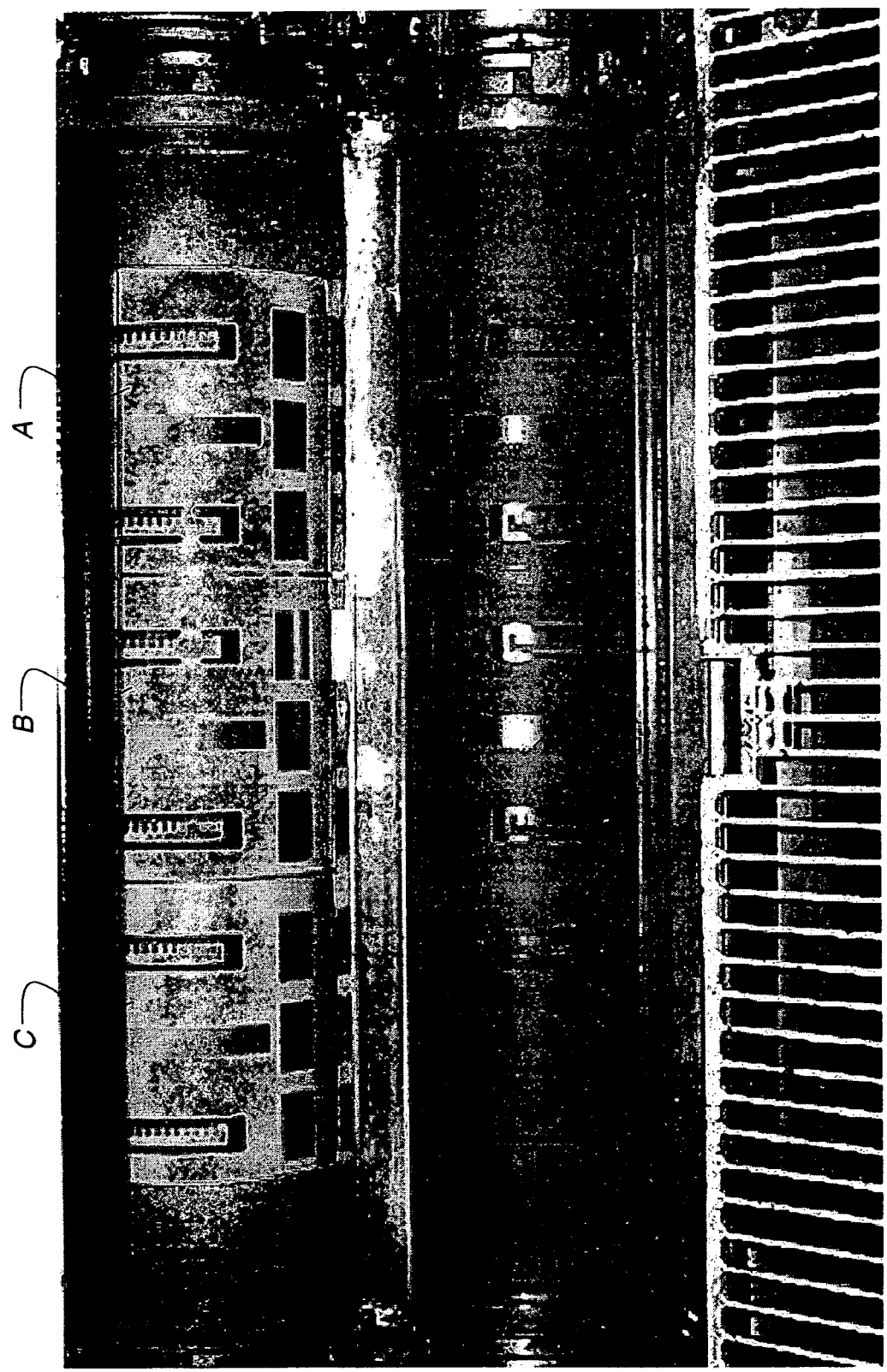
FIG. 7 is a black-and-white image showing development results described in Example 7 below.

The Komori printing press was operated with the ink-feed system engaged with the printing plate cylinder for 20 cylinder revolutions, followed by both the ink-feed system and the fountain-feed system engaged with the printing cylinder for another 20 revolutions. FIG. 7 shows that complete on-press development of printing plates A, B, and C was achieved.

Example 8

Figure 8:
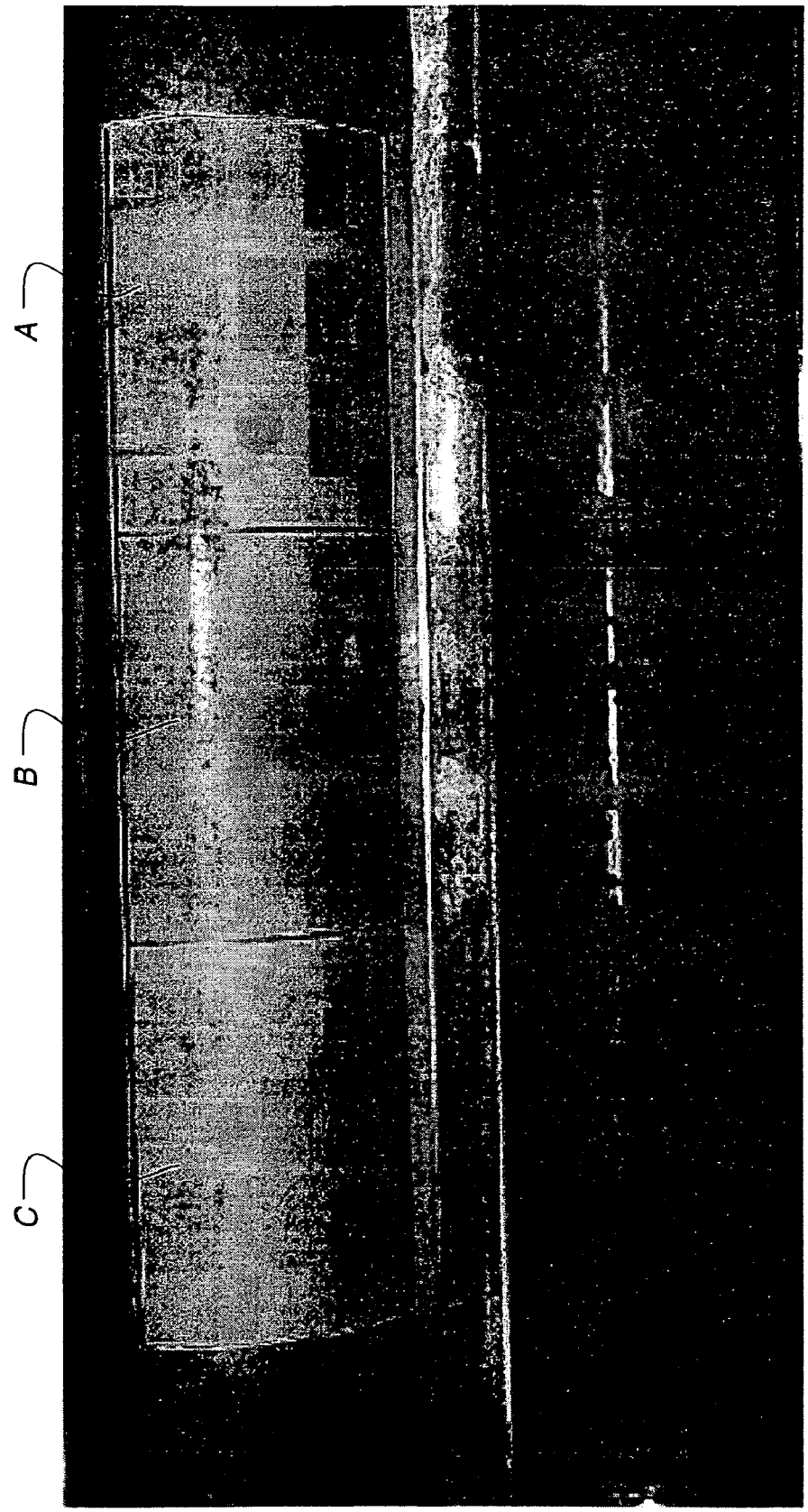
FIG. 8 is a black-and-white image showing development results described in Example 8 below.

The Komori printing press was operated with the fountain-feed system engaged with the printing plate cylinder for 20 cylinder revolutions. FIG. 8 shows that printing plate B was not developed on-press. Printing plate A was completely developed on-press, and printing plate C was partially (mostly) developed.

Example 9

Printing plate C was mounted onto the Komori printing press that was then operated with both the ink-feed and fountain-feed systems engaged with the printing plate cylinder for 20 revolutions. Complete on-press development of printing plate C was observed.

Example 10

Figure 9:
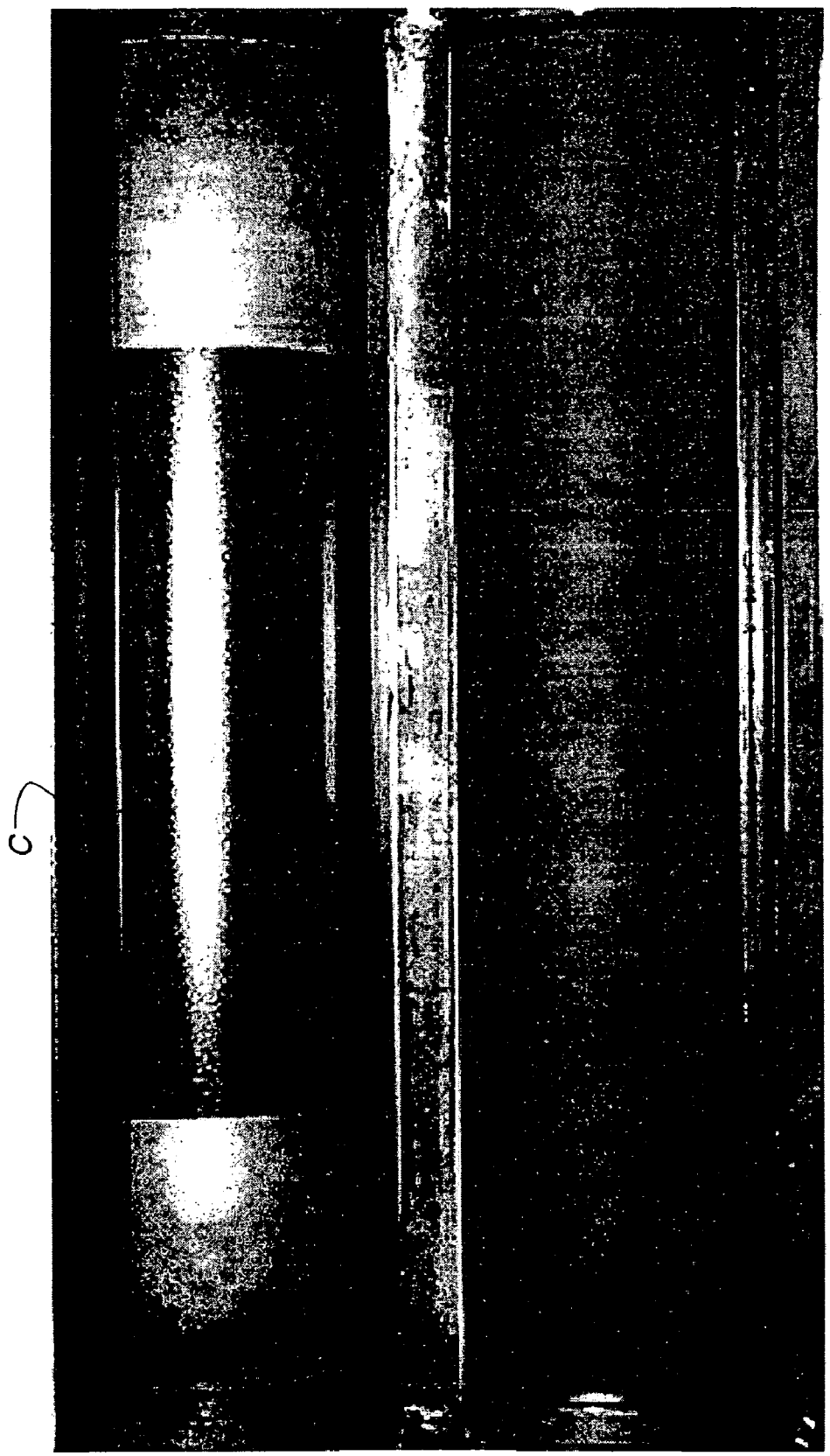
FIG. 9 is a black-and-white image showing development results described in Example 10 below.

Printing plate C was mounted onto the Komori printing press that was then operated with the ink-feed system engaged with the printing plate cylinder for 20 revolutions. As shown in FIG. 9, no on-press development of printing plate C occurred.

Although the present invention has been described in connection with specific exemplary embodiments, it should be understood that various changes, substitutions and alterations can be made to the disclosed embodiments without departing from the spirit and scope of the invention as set forth in the appended claims.

The invention claimed is:

1. A method of providing a lithographic printing plate comprising:
   A) imagewise exposing an on-press developable, negative-working imageable element to provide an imaged element with an imaged layer containing both exposed regions and non-exposed regions,
   B) prior or subsequently to step A, mounting said imageable element onto a lithographic printing press,
   C) after steps A and B, contacting said imaged layer on-press with water or a fountain solution but not a lithographic printing ink for sufficient time to swell said non-exposed regions of said imaged layer but leaving said non-exposed regions of said imaged layer substantially intact on said substrate,
   D) contacting said imaged layer with swollen non-exposed regions simultaneously wit water or fountain solution and a lithographic printing ink to substantially remove said non-exposed regions only, and
   E) simultaneously with or subsequently to step D, using said imaged element to print an image on a receiver material,
   said on-press developable negative-working imageable element comprising an infrared radiation imageable layer on a substrate, said imageable layer comprising:
   a free radically polymerizable component,
   a free radical initiator composition,
   an infrared radiation absorbing compound, and
   a polymer binder, wherein said polymeric binder comprises a polymer backbone comprising recurring units having pendant (alkylene glycol) side chains and is at least in part, in particulate form,
   said imageable layer being completely removable prior to irradiation only when contacted, sequentially or simultaneously, with either water or a fountain solution and a lithographic printing ink.

2. The method of claim 1 wherein said pendant (alkylene glycol) side chains have a number average molecular weight of at least 300 and up to 10,000.

3. The method of claim 1 wherein said polymeric binder further comprises recurring units having pendant cyano groups.

4. The method of claim 1 wherein said free radically polymerizable component or said infrared radiation absorbing compound is insoluble in water or fountain solution alone.

5. The method of claim 1 wherein said imageable element further comprising a colorant that is insoluble in water or fountain solution alone.

6. The method of claim 1 wherein said free radical initiator composition comprises an onium salt.

7. The method of claim 6 wherein said free radical initiator composition comprises an iodonium borate.

8. The method of claim 6 wherein said free radical initiator composition comprises a diaryliodonium tetrasrylborate.

9. The method of claim 1 wherein said imaging is carried out by an IR laser at a wavelength of from about 700 to about 1200 nm.

10. A method of providing a lithographic printing plate comprising:
   A) imagewise exposing an on-press developable. negative-working imageable element to provide an imaged element with an imaged layer containing both exposed regions and non-exposed regions,
   B) prior or subsequently to step A, mounting said imageable element onto a lithographic printing press,
   C) after steps A and B, contacting said imaged layer on-press with a lithographic printing ink but not water or a fountain solution,
   D) contacting said imaged layer with both water or fountain solution and a lithographic printing ink to substantially remove said non-exposed regions only, and
   E) simultaneously with or subsequently to step D, using said imaged element to print an image on a receiver material,
   said on-press developable negative-working imageable element comprising an infrared radiation imageable layer on a substrate, said imageable layer comprising:
   a free radically polymerizable component,
   a free radical initiator composition,
   an infrared radiation absorbing compound, and
   a polymer binder,
   said imageable layer being completely removable prior to irradiation only when contacted, sequentially or simultaneously, with either water or a fountain solution and a lithographic printing ink.

11. The method of claim 10 wherein said polymeric binder is composed of recurring units comprising pendant (ethylene glycol) units and at least 50 weight % of all recurring units are recurring units comprising pendant cyano groups.

12. The method of claim 10 wherein before exposure to imaging radiation, said imageable layer is incompletely soluble in water or a fountain solution alone.

13. The method of claim 10 wherein said substrate is a grained, phosphoric acid-anodized aluminum-containing substrate.

* * * * *